United States Patent
Kanna et al.

(10) Patent No.: US 6,806,023 B2
(45) Date of Patent: Oct. 19, 2004

(54) POSITIVE RADIATION-SENSITIVE COMPOSITION

(75) Inventors: Shinichi Kanna, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 20 days.

(21) Appl. No.: 09/851,113

(22) Filed: May 9, 2001

(65) Prior Publication Data

US 2001/0055726 A1 Dec. 27, 2001

(30) Foreign Application Priority Data

May 10, 2000 (JP) .................................... P.2000-137461

(51) Int. Cl.⁷ .............................................. G03F 7/004
(52) U.S. Cl. ..................... 430/270.1; 430/905; 430/914
(58) Field of Search ............................. 430/270.1, 905, 430/914

(56) References Cited

U.S. PATENT DOCUMENTS 5,627,006 A * 5/1997 Urano et al. ................ 430/192
5,663,035 A * 9/1997 Masuda et al. ........... 430/270.1
5,852,128 A * 12/1998 Padmanaban et al. ... 525/328.8
6,485,883 B2 * 11/2002 Kodama et al. ............. 430/170
2002/0012866 A1 * 1/2002 Nishiyama et al.

FOREIGN PATENT DOCUMENTS

| JP | A-2-19847 | 1/1990 |
|---|---|---|
| JP | A-4-219757 | 8/1992 |
| JP | A-5-181279 | 7/1993 |
| JP | A-5-249682 | 9/1993 |
| JP | A-5-323590 | 12/1993 |
| JP | A-8-123032 | 5/1996 |
| JP | A-8-253534 | 10/1996 |
| JP | A-11-125907 | 5/1999 |

* cited by examiner

Primary Examiner—Rosemary Ashton
(74) Attorney, Agent, or Firm—Sughrue Mion, PLLC

(57) ABSTRACT

A positive radiation-sensitive composition comprising:
  (a) a resin whose solubility in an alkali developer increases by the action of an acid;
  (b) a compound which generates a carboxylic acid having a molecular weight of 100 or less upon irradiation with an actinic ray or a radiant ray;
  (c) a surfactant; and
  (d) a solvent.

13 Claims, No Drawings

POSITIVE RADIATION-SENSITIVE COMPOSITION

FIELD OF THE INVENTION

The present invention relates to a positive radiation-sensitive composition for use in the manufacturing process of semiconductors, e.g., a lithographic printing plate and IC, the manufacture of circuit substrates, e.g., a liquid crystal and a thermal head, and other photo fabrication processes.

BACKGROUND OF THE INVENTION

As the resists for use in the pattern formation of lithography using far ultraviolet rays and eximer laser beams, there are chemical amplification resist compositions disclosed in U.S. Pat. No. 4,491,628 and European Patent 29,139. The chemical amplification photoresist is a pattern-forming material of generating an acid on the exposed area upon irradiation with radiation such as far ultraviolet ray and causing a reaction using the acid generated as a catalyst to change the solubility in a developer of the areas irradiated or not irradiated with the active radiation and thereby form a pattern on the substrate.

The above chemical amplification positive resist compositions can be classified roughly into the following, i.e., a three-component system comprising an alkali-soluble resin, a compound which generates an acid upon radiation exposure (a photo-acid generator), and a dissolution-inhibiting compound which inhibits the dissolution of an alkali-soluble resin and has an acid-decomposable group; a two-component system comprising a resin having a group capable of becoming alkali-soluble by being decomposed upon reacting with an acid, and a photo-acid generator; and a hybrid system comprising a resin having a group capable of becoming alkali-soluble by being decomposed upon reacting with an acid, a low molecular weight dissolution-inhibiting compound having an acid-decomposable group, and a photo-acid generator.

JP-A-5-323590 (the term "JP-A" as used herein means an "unexamined published Japanese patent application") discloses to use two kinds of photo-acid generators, JP-A-5-181279 discloses to use a photo-acid generator which generates a strong acid and a photo-acid generator which generates a weak acid, and JP-A-11-125907 discloses to use a compound which generates a carboxylic acid having a boiling point of 150° C. or higher and a compound which generates acids other than a carboxylic acid.

Further, JP-A-2-19847 discloses a resist composition which is characterized in that the composition contains a resin in which the phenolic hydroxyl group of poly(p-hydroxystyrene) is entirely or partially protected with a tetrahydropyranyl group.

JP-A-4-219757 discloses a resist composition which is characterized in that the composition contains a resin in which from 20 to 70% of the phenolic hydroxyl group of poly(p-hydroxystyrene) is substituted with an acetal group.

Further, JP-A-5-249682 discloses a photoresist composition using a similar resin protected with an acetal group. JP-A-8-123032 discloses a photoresist composition using a ternary copolymer containing a group substituted with an acetal group.

Furthermore, JP-A-8-253534 discloses a photoresist composition using a partially crosslinked polymer containing a group substituted with an acetal group.

Although these chemical amplification positive resists can be used effectively as the series capable of ultra minute processing for shorter wavelength light sources, chemical amplification photoresists capable of obtaining excellent resolving power and pattern profiles even when considerable time has elapsed after exposure until post-baking, i.e., having large tolerance of process, are further required. The above-described conventional techniques cannot satisfy sufficiently this requirement.

SUMMARY OF THE INVENTION

An object of the present invention is to provide a positive radiation-sensitive composition of a chemical amplification positive resist having large tolerance of process capable of obtaining excellent resolving power and a pattern profile even when considerable time has elapsed after exposure until post-baking.

The above object of the present invention has been achieved by the following means.

(1) A positive radiation-sensitive composition comprising:
 (a) a resin whose solubility in an alkali developer increases by the action of an acid;
 (b) a compound that generates a carboxylic acid having a molecular weight of 100 or less upon irradiation with an actinic ray or a radiant ray;
 (c) a surfactant; and
 (d) a solvent.

(2) The positive radiation-sensitive composition as described in the above item (1), which further comprises (b') a compound that generates a sulfonic acid upon irradiation with an actinic ray or a radiant ray.

(3) The positive radiation-sensitive composition as described in the above item (1), wherein the compound (b) is a compound represented by the following formula (I):

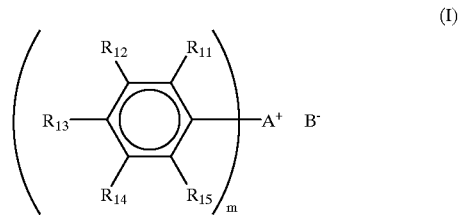

wherein $R_{11}$, $R_{12}$, $R_{13}$, R14 and $R_{15}$ each independently represents a hydrogen atom, a straight chain, branched or cyclic alkyl group, a straight chain, branched or cyclic alkoxyl group, a hydroxyl group, a halogen atom, or —S—$R_0$; $R_0$ represents a straight chain, branched or cyclic alkyl group, or an aryl group; $A^+$ represents $S^+$ or $I^+$; $B^-$ represents $CH_3COO^-$, $C_2H_5COO^-$ or $C_3H_7COO^{31}$; and m represents 2 or 3.

(4) The positive radiation-sensitive composition as described in the above item (1), wherein the resin (a) has an acid-decomposable group represented by the following formula (II):

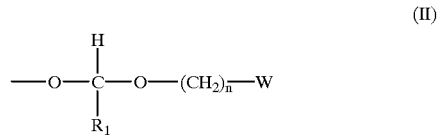

wherein $R_1$ represents an alkyl group having from 1 to 4 carbon atoms; W represents an amino group, an ammonium group, a mercapto group, a substituted or unsubstituted aryl group, a substituted or unsubstituted cycloalkyl group, or an organic group containing (i) at least one atom selected from the group consisting of an oxygen atom, a nitrogen atom, a sulfur atom, a phosphorus atom and a silicon atom, and (ii) at least one carbon atom; and n represents a natural number of from 1 to 4.

(5) The positive radiation-sensitive composition as described in the above item (1), wherein the resin (a) is a resin in which phenolic hydroxyl groups in an alkali-soluble resin are at least partly protected with the acid-decomposable group represented by the formula (II).

(6) The positive radiation-sensitive composition as described in the above item (1), which further comprises an organic basic compound.

(7) The positive radiation-sensitive composition as described in the above item (1), wherein the compound (b) is at least one compound selected from the group consisting of the following (PAG-B1) to (PAG-B6):

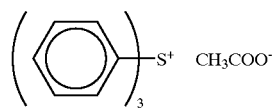
(PAG-B1)

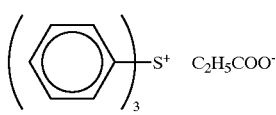
(PAG-B2)

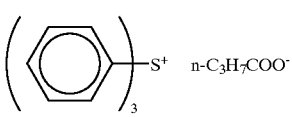
(PAG-B3)

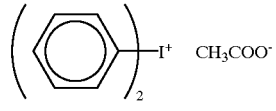
(PAG-B4)

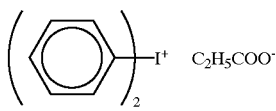
(PAG-B5)

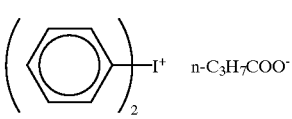
(PAG-B6)

(8) The positive radiation-sensitive composition as described in the above item (7), wherein the compound (b) is at least one compound selected from the group consisting of the above (PAG-B1) and (PAG-B4):

(9) The positive radiation-sensitive composition as described in the above item (1), which contains the compound (b) in an amount of from 1 to 20 wt % based on the solid contents.

(10) The positive radiation-sensitive composition as described in the above item (2), wherein the compound (b') is a compound represented by the following formula (PAG3), (PAG4) or (PAG6):

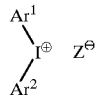
(PAG3)

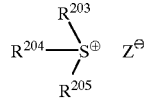
(PAG4)

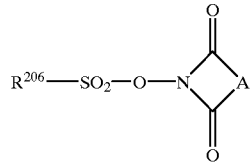
(PAG6)

wherein $Ar^1$ and $Ar^2$ each independently represents a substituted or unsubstituted aryl group; $R^{203}$, $R^{204}$ and $R^{205}$ each independently represents a substituted or unsubstituted alkyl or aryl group; $R^{206}$ represents a substituted or unsubstituted alkyl or aryl group; A represents a substituted or unsubstituted alkylene, alkenylene or arylene group.

(11) The positive radiation-sensitive composition as described in the above item (2), which contains the compound (b') in an amount of from 1 to 20 wt % based on the solid contents.

(12) The positive radiation-sensitive composition as described in the above item (4), wherein W of said formula (II) is a group represented by the following formula:

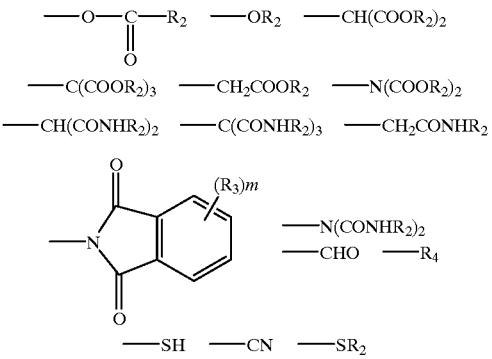

wherein $R_2$ represents a hydrogen atom, a straight chain, branched or cyclic alkyl group having from 1 to 6 carbon atoms, a straight chain, branched or cyclic alkenyl group having from 2 to 6 carbon atoms, a substituted or unsubstituted aryl group, or a substituted or unsubstituted aralkyl group; $R_3$ represents a hydrogen atom, a straight chain, branched or cyclic alkyl group having from 1 to 6 carbon atoms, a straight chain, branched or cyclic alkoxyl group having from 1 to 6 carbon atoms, a halogen atom, a nitro group, an amino group, a hydroxyl group, or a cyano group; X represents a halogen atom; $R_4$ represents a substituted or unsubstituted aryl group, or a substituted or unsubstituted cycloalkyl group having from 3 to 15 carbon atoms; m represents a natural number of from 1 to 4.

(13) The positive radiation-sensitive composition as described in the above item (4), wherein the resin (a) is a resin in which 5 to 45 mol % of an entire phenolic hydroxyl groups in an alkali-soluble resin are protected with an acid-decomposable group represented by the formula (II).

(14) The positive radiation-sensitive composition as described in the above item (1), wherein the resin (a) has a weight average molecular weight of from 3,000 to 80,000.

(15) The positive radiation-sensitive composition as described in the above item (1), wherein the surfactant (c) contains at least one of a fluorine atom and a silicon atom.

DETAILED DESCRIPTION OF THE INVENTION

The components contained in the positive radiation-sensitive composition according to the present invention such as compounds and resins are described in detail below.

[I] (a) Resin Whose Solubility in Alkali Developer Increases by the Action of Acid As the preferred example of the above resin, a resin having the structure of alkali-soluble group being protected with an acid-decomposable group (a protective group) can be exemplified (hereinafter this resin is also referred to as "(a) an acid-decomposable resin").

As the alkali-soluble groups, a phenolic hydroxyl group, a carboxyl group, and a sulfonic acid group can be exemplified. A phenolic hydroxyl group is preferred of these.

Of acid-decomposable resins (a), a resin in which the phenolic hydroxyl group in the alkali-soluble resin is protected with an acid-decomposable group represented by formula (II) is preferred.

The alkali-soluble resin containing a phenolic hydroxyl group is preferably a copolymer or a homopolymer thereof containing at least 30 mol %, preferably 50 mol % or more, of o-, m- or p-hydroxystyrene, or o-, m- or p-hydroxy-α-methylstyrene, or a partially hydrogenated resin, and more preferably a p-hydroxystyrene homopolymer.

As the co-monomers of the above copolymers, acrylic esters, methacrylic esters, acrylamides, methacrylamides, acryslonitrile, methacrylonitrile, maleic anhydride, styrene, α-methylstyrene, acetoxystyrene, and alkoxystyrenes are preferably used, and styrene, acetoxystyrene and t-butoxystyrene are more preferably used.

These alkali-soluble resins have a weight average molecular weight of preferably from 3,000 to 80,000, more preferably from 7,000 to 50,000, as the value based on polystyrene obtained by GPC measurement. The molecular weight distribution (Mw/Mn) of the alkali-soluble resins is generally from 1.01 to 4.0, preferably from 1.05 to 1.20. For obtaining the polymer having this range of molecular weight distribution, methods such as anion polymerization, etc., are preferably used.

In formula (II):

n represents a natural number of from 1 to 4, preferably 2 or 3.

$R_1$ preferably represents methyl, ethyl, n-propyl, isopropyl, n-butyl, isobutyl, sec-butyl, or t-butyl, more preferably methyl.

The organic group represented by W is an organic group containing (i) at least one atom selected from the group consisting of an oxygen atom, a nitrogen atom, a sulfur atom, a phosphorus atom and a silicon atom, and (ii) at least one carbon atom.

More specifically, W preferably represents the groups shown below.

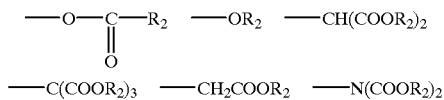

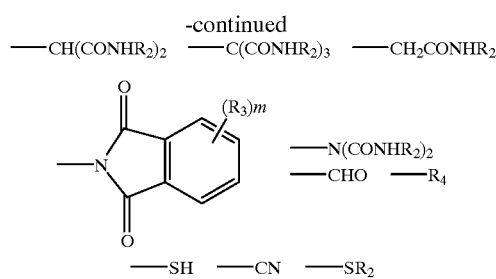

wherein $R_2$ represents a hydrogen atom, a straight chain, branched or cyclic alkyl group having from 1 to 6 carbon atoms, a straight chain, branched or cyclic alkenyl group having from 2 to 6 carbon atoms, a substituted or unsubstituted aryl group, or a substituted or unsubstituted aralkyl group.

$R_3$ represents a hydrogen atom, a straight chain, branched or cyclic alkyl group having from 1 to 6 carbon atoms, a straight chain, branched or cyclic alkoxyl group having from 1 to 6 carbon atoms, a halogen atom, a nitro group, an amino group, a hydroxyl group, or a cyano group.

$R_4$ represents a substituted or unsubstituted aryl group, or a substituted or unsubstituted cycloalkyl group having from 3 to 15 carbon atoms.

m represents a natural number of from 1 to 4, preferably 1 or 2.

As the straight chain, branched or cyclic alkyl group having from 1 to 6 carbon atoms represented by $R_2$ and $R_3$, methyl, ethyl, n-propyl, isopropyl, cyclopropyl, n-butyl, isobutyl, sec-butyl, t-butyl, pentyl, isopentyl, neopentyl, cyclopentyl, hexyl and cyclohexyl are preferred, and methyl and ethyl are more preferred.

As the straight chain, branched or cyclic alkenyl group having from 2 to 6 carbon atoms represented by $R_2$, vinyl, 1-propenyl, allyl, isopropenyl, 1-butenyl, 2-butenyl, 2-pentenyl and cyclohexenyl are preferred, and vinyl and isopropenyl are more preferred.

As the aryl group represented by $R_2$ and $R_4$, phenyl, tolyl, xylyl, mesityl and cumenyl are preferred, and phenyl is more preferred. As the aralkyl group represented by $R_2$, benzyl, phenethyl, α-methylbenzyl, benzhydryl are preferred, and benzyl is more preferred. As the cycloalkyl group having from 3 to 15 carbon atoms represented by $R_4$, a cyclobutyl group, a cyclopentyl group, and a cyclohexyl group are preferred.

These aryl, aralkyl and cycloalkyl groups may be substituted with a halogen atom, a nitro group, an alkoxyl group, an acetyl group, an amino group, an ester group, or an amido group.

As the straight chain, branched or cyclic alkoxyl group having from 1 to 6 carbon atoms represented by $R_3$, methoxy, ethoxy, propoxy, isopropoxy, butoxy, pentyloxy and hexyloxy are preferred, and methoxy and ethoxy are more preferred.

As the halogen atom, fluorine, chlorine, bromine and iodine are preferred, and chlorine and bromine are more preferred.

W may represent a cyano group or a formyl group as described above.

More specific examples of the protective groups represented by formula (II) are shown below, but the present invention is not limited thereto. In the following formulae, Me represents a methyl group, Et represents an ethyl group and Ph represents a phenyl group.

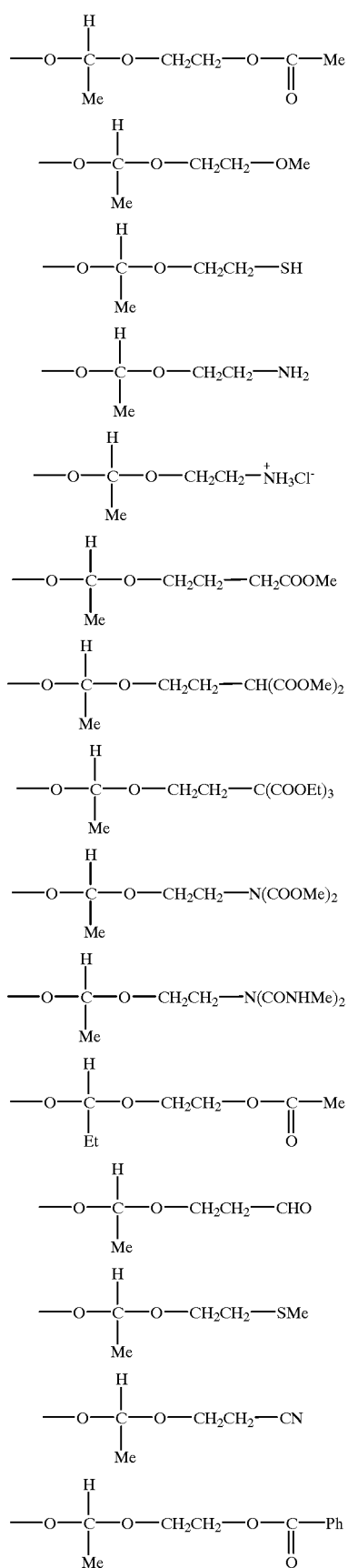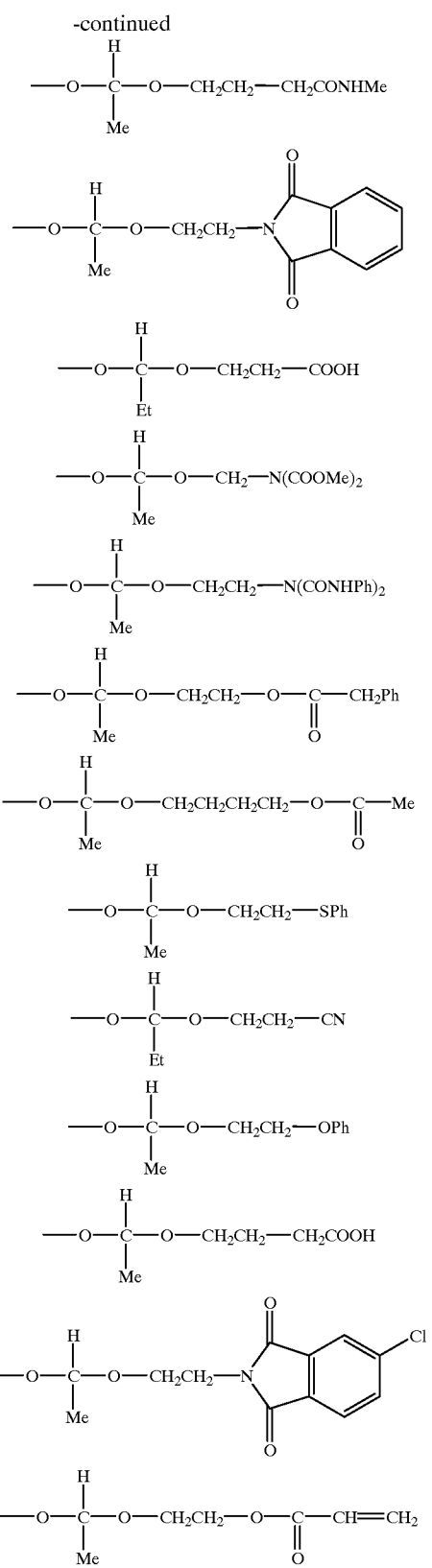
-continued
Acid-decomposable resin (a) containing a phenolic hydroxyl group protected with the protective group described above can be obtained by synthesizing the corresponding vinyl ether and reacting the obtained vinyl ether with a phenolic hydroxyl group-containing alkali-soluble resin dissolved in an appropriate solvent, e.g., tetrahydrofuran, by well-known methods.

The reaction is generally performed in the presence of an acidic catalyst, preferably an acidic ion exchange resin, a hydrochloric acid, a p-toluenesulfonic acid, or a salt such as pyridinium tosylate. The corresponding vinyl ether can be synthesized from an active material such as a chloroethyl vinyl ether by a nucleophilic substitution reaction, etc.

Preferred specific examples of acid-decomposable resin (a) are shown below by the repeating unit constituting each resin, but the present invention is not limited thereto. In the following formulae, Me represents a methyl group, Et represents an ethyl group, Ph represents a phenyl group, tBu represents a t-butyl group, and Ac represents an acetyl group.

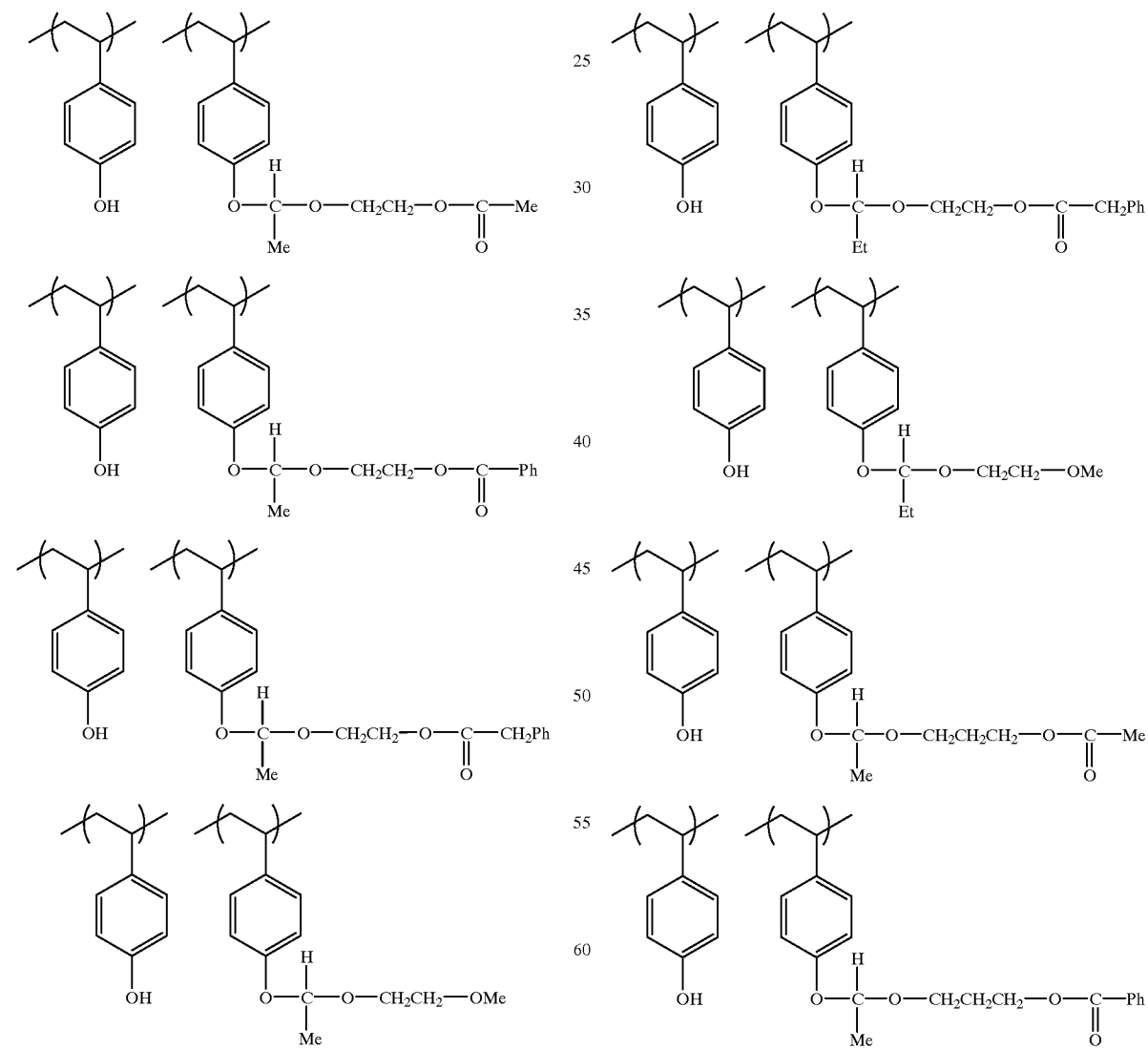

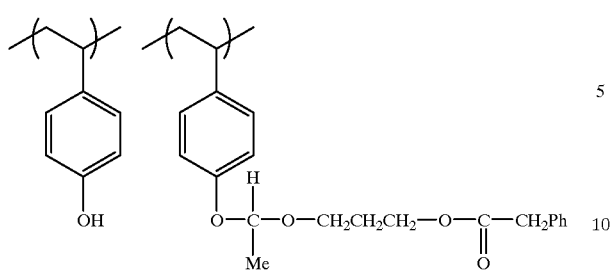
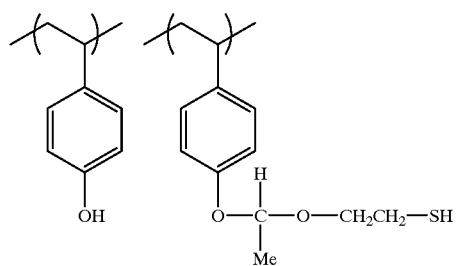
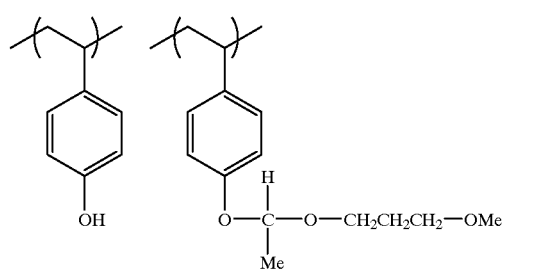
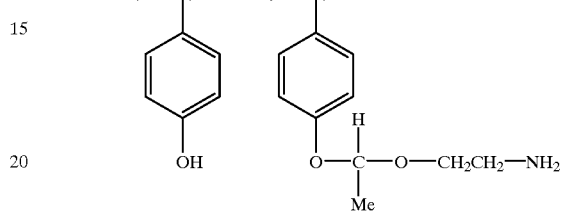
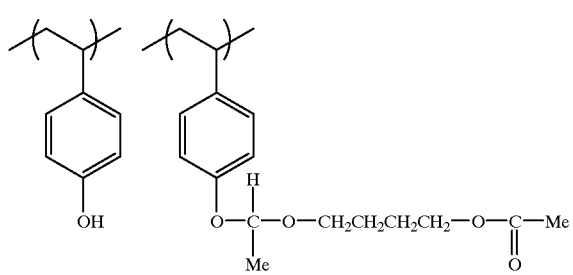
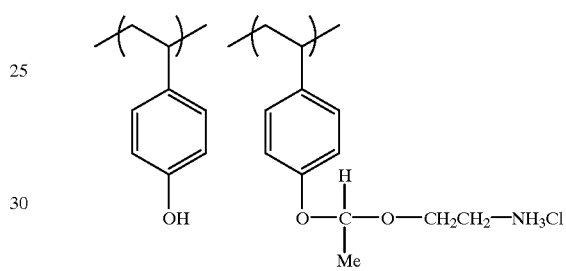
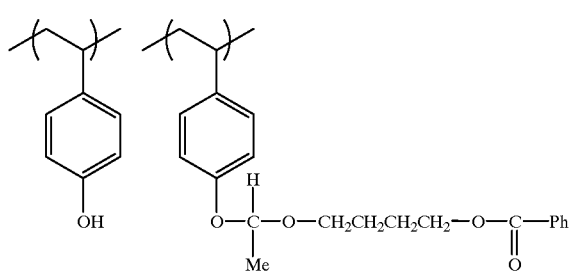
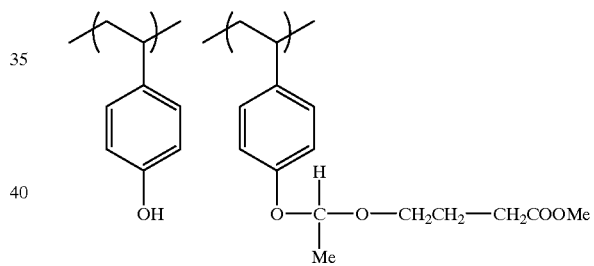
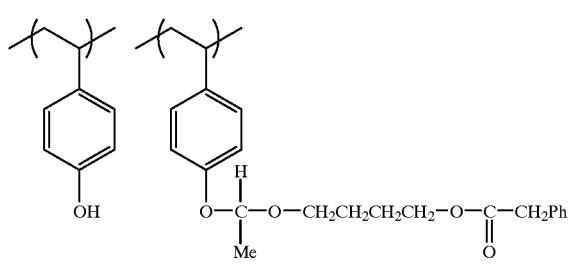
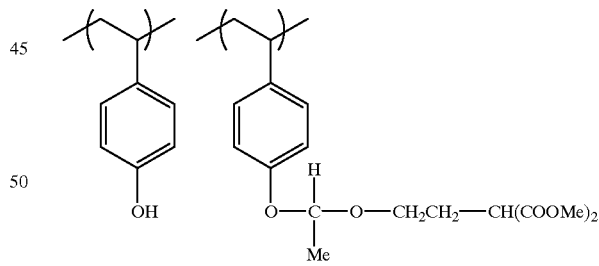
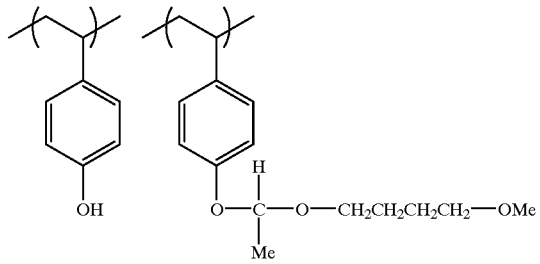
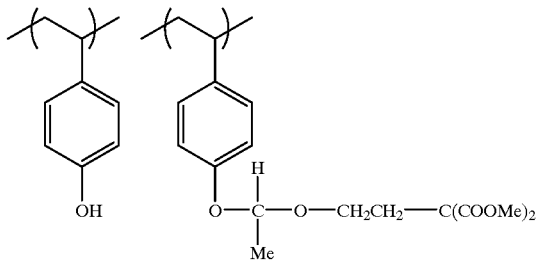

13
-continued
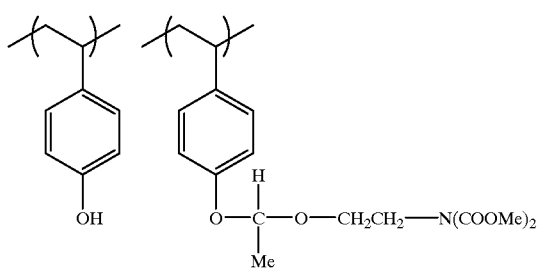
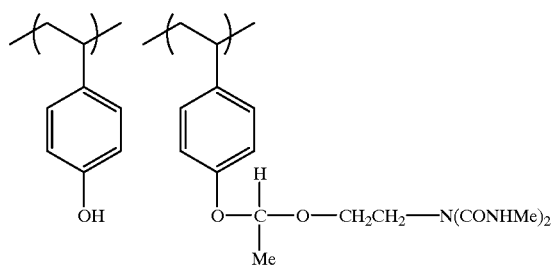
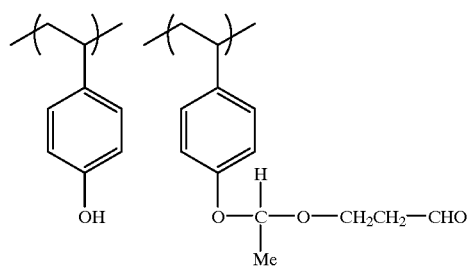
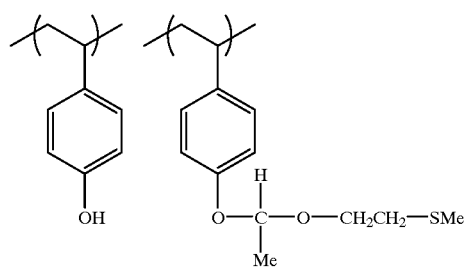
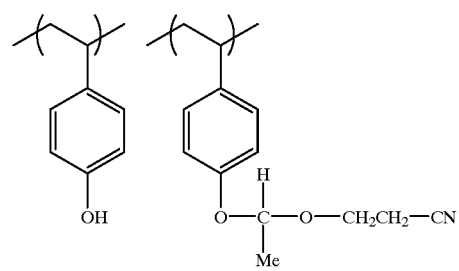
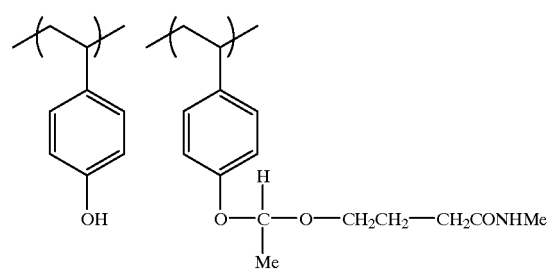
14
-continued
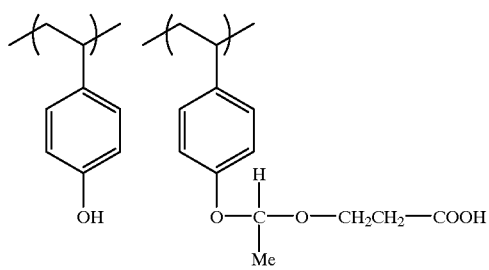
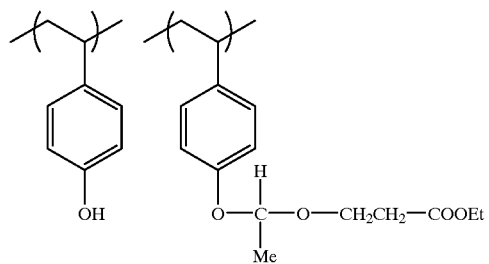
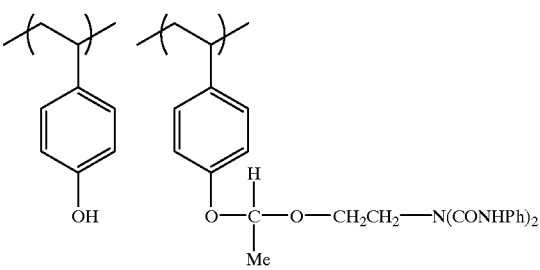
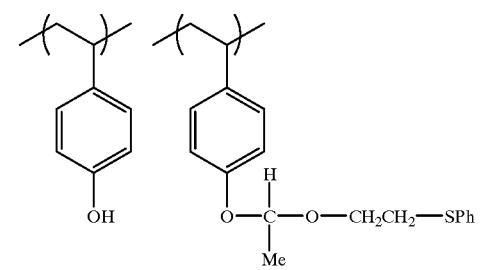
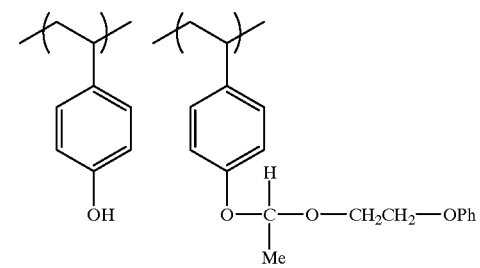
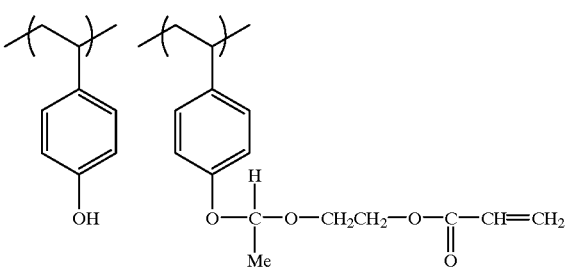

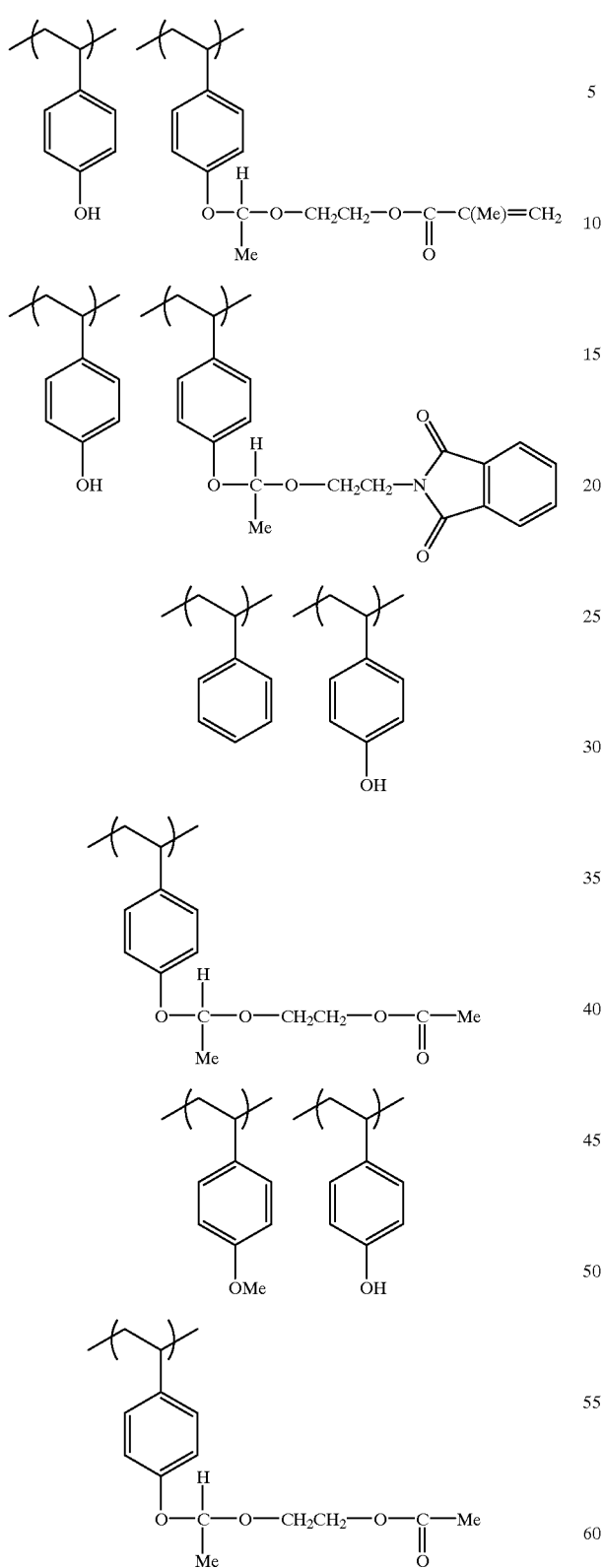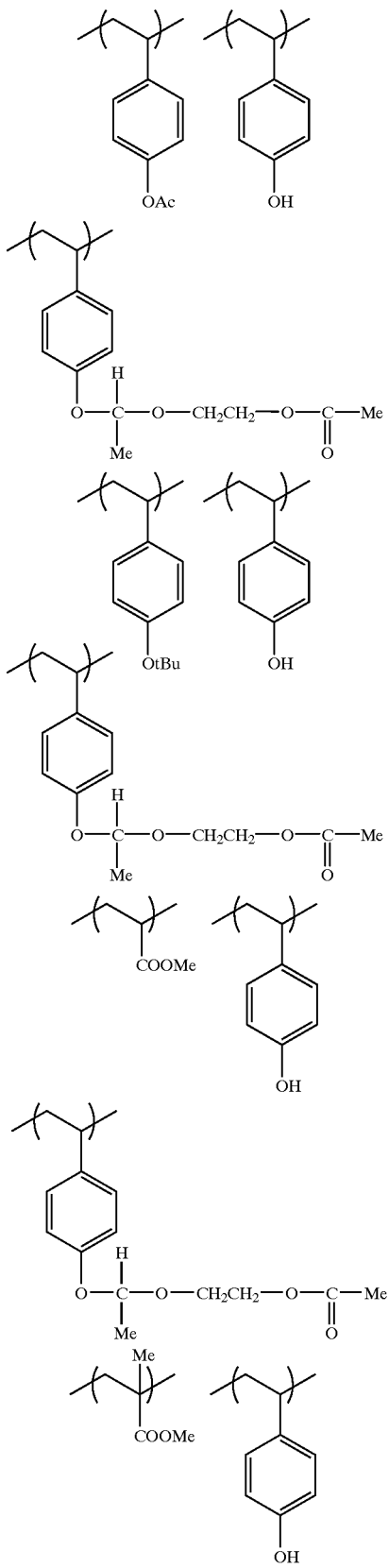

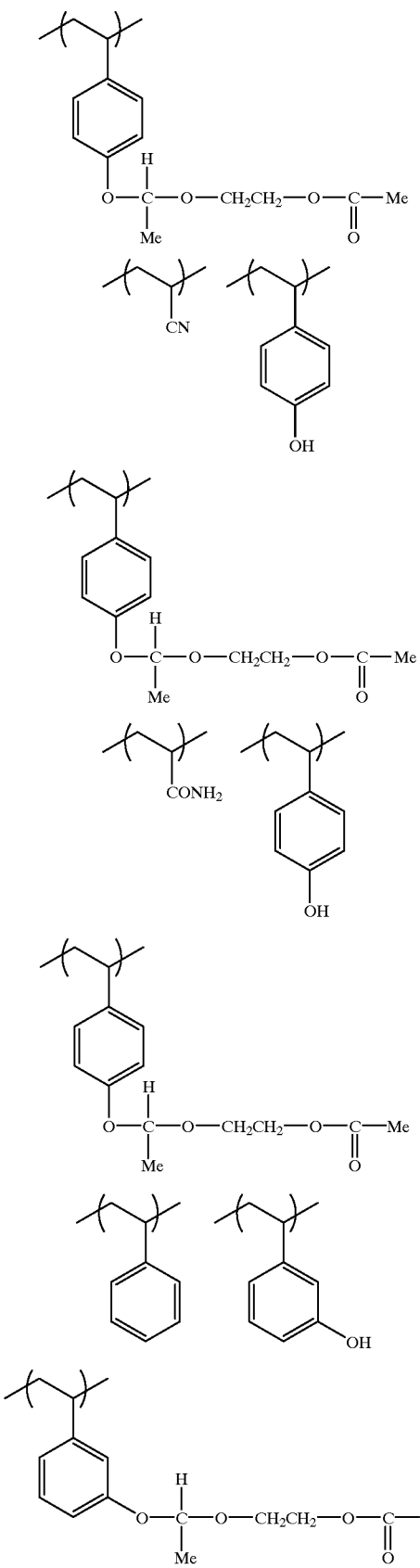
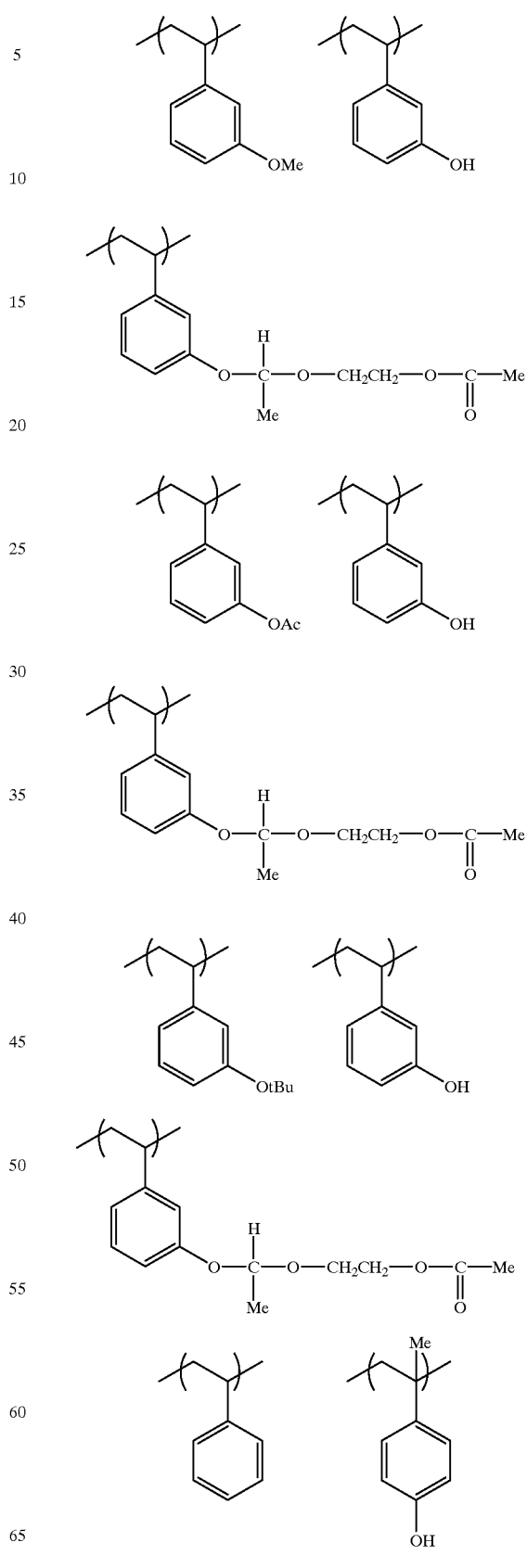

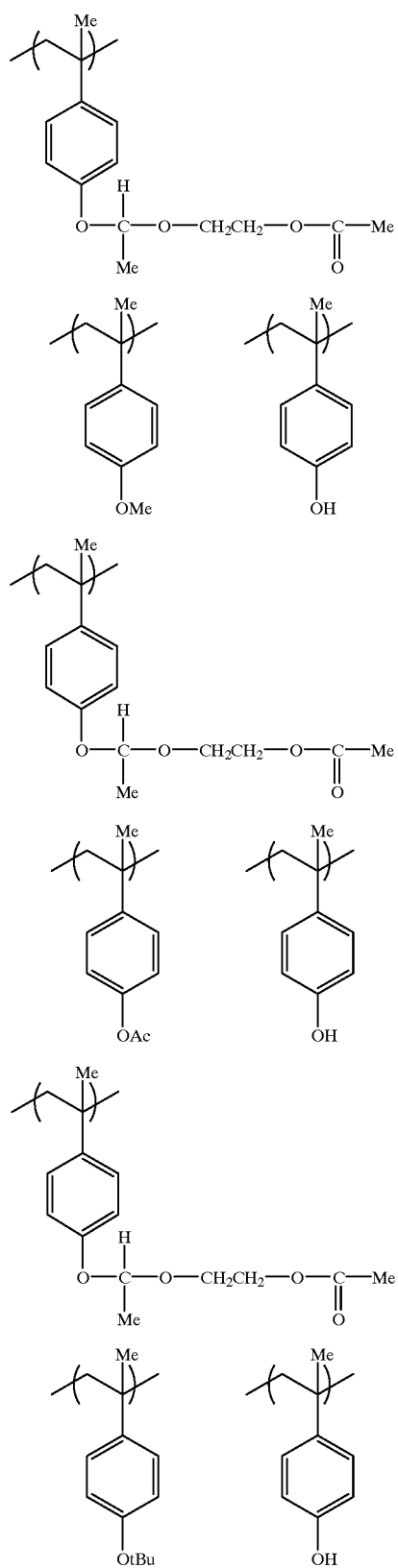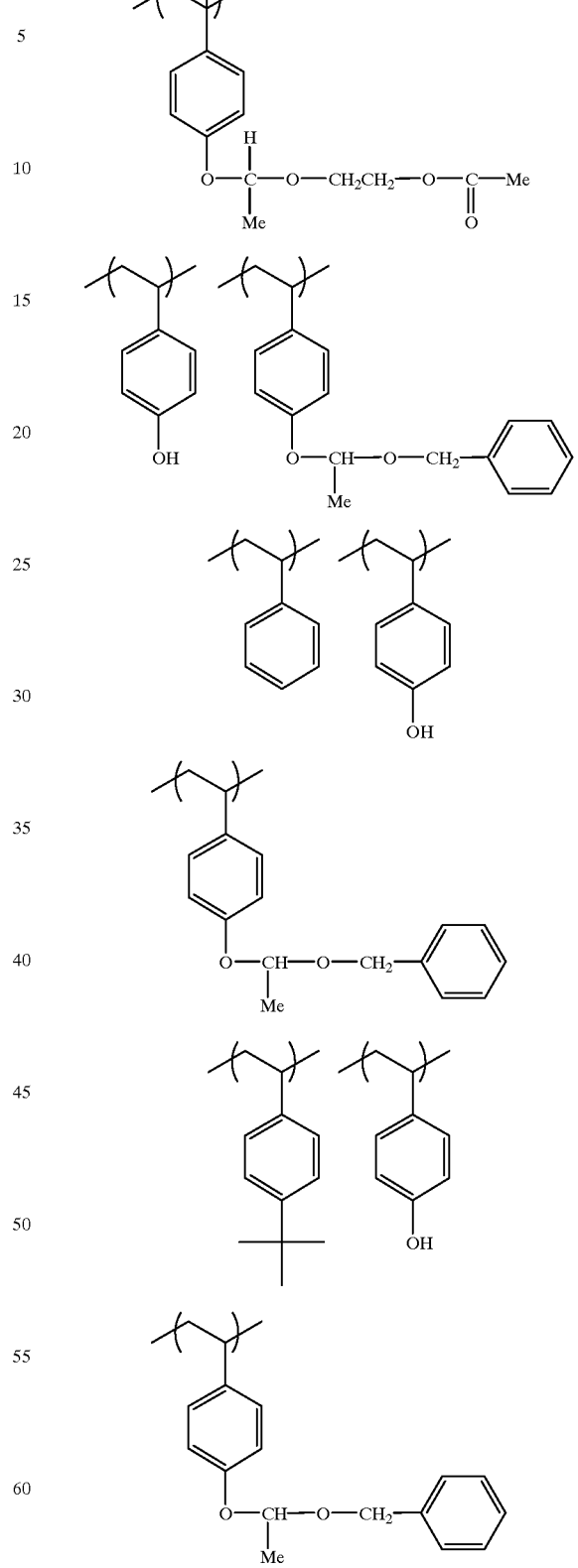

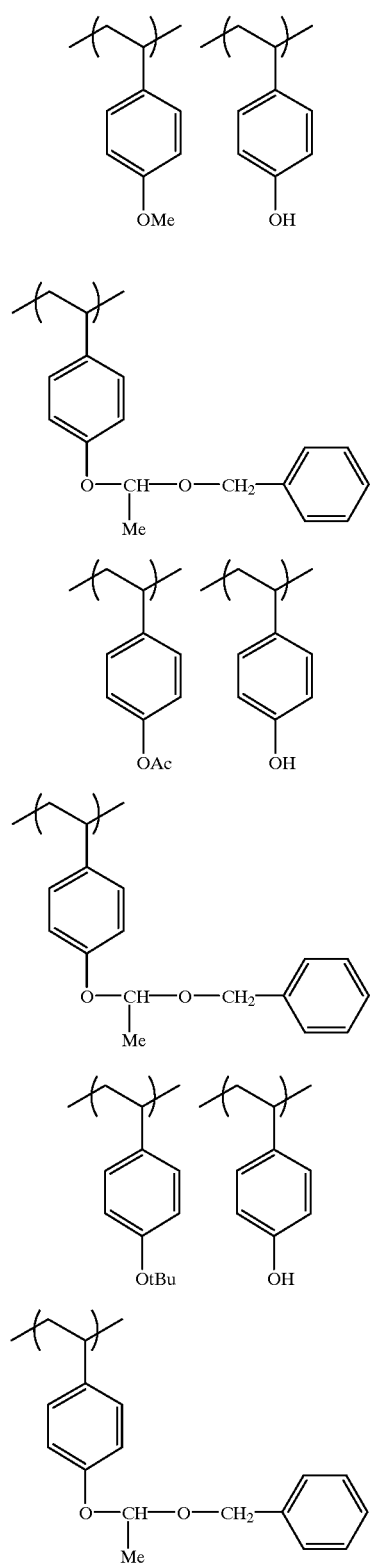
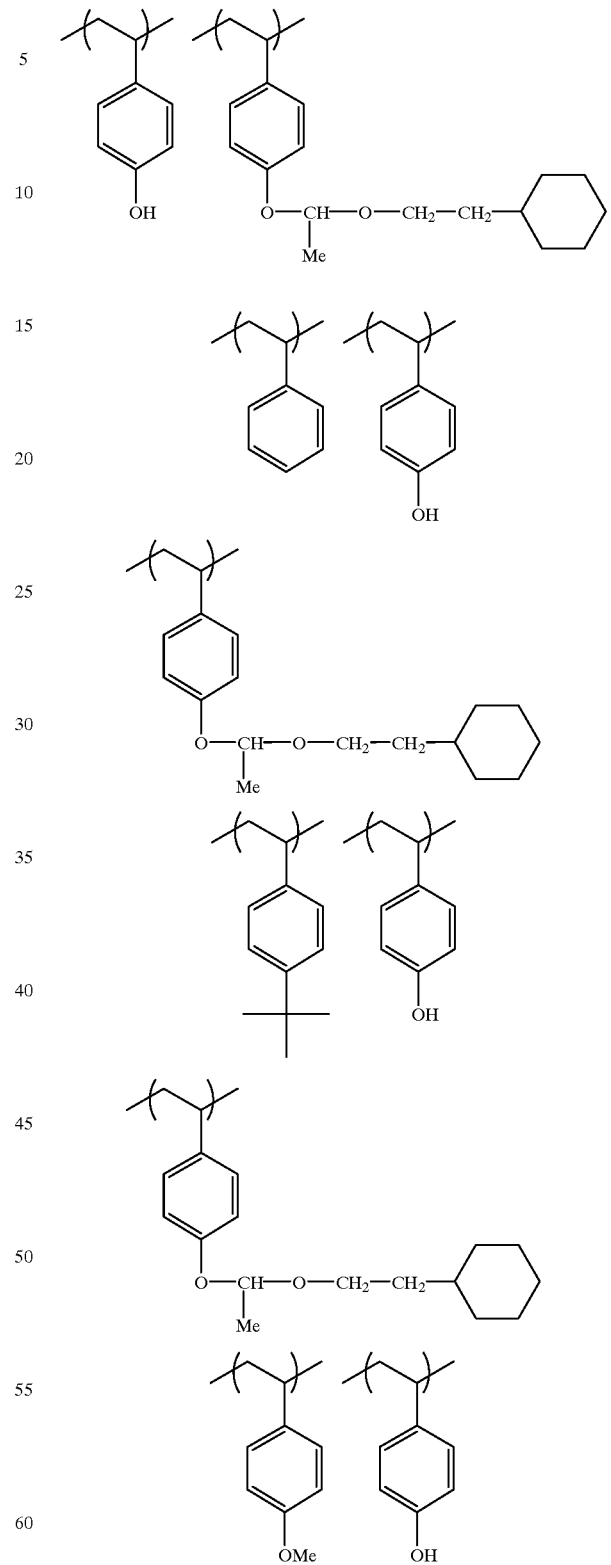

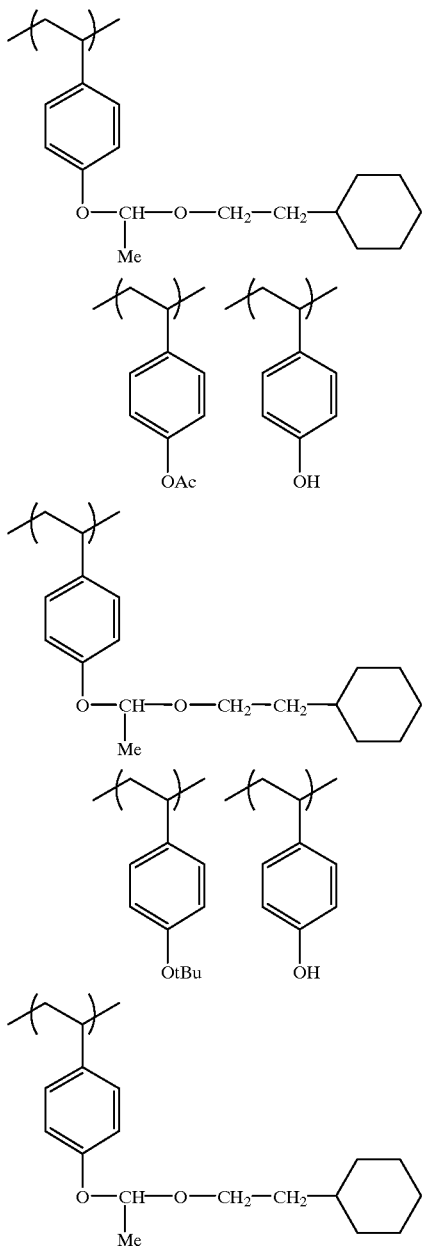

It is preferred for the composition according to the present invention to contain, as (a) a resin whose solubility in an alkali developer increases by the action of an acid, the above-described resin in which the phenolic hydroxyl group is protected with a protective group represented by formula (II).

The degree of protection by a protective group represented by formula (II) is preferably from 5 to 45 mol %, more preferably from 10 to 30 mol %, of the entire phenolic hydroxyl groups in the resin.

The total use amount of (a) a resin whose solubility in an alkali developer increases by the action of an acid in the composition according to the present invention is from 10 to 99.9 wt %, more preferably from 50 to 99.5 wt %, and still more preferably from 70 to 99.0 wt %, based on the total weight (exclusive of the solvent) of the composition.

The composition according to the present invention can comprise an alkali-soluble resin not containing the acid-decomposable group such as one represented by formula (II), by which the sensitivity is improved. As the alkali-soluble resins not containing an acid-decomposable group (hereinafter referred to as merely "alkali-soluble resins"), novolak resins, novolak resin derivatives; poly(p-hydroxystyrene), copolymers containing a p-hydroxystyrene unit, e.g., p/m-hydroxystyrene copolymers, p/o-hydroxystyrene copolymers, and p-hydroxystyrene/styrene copolymers; alkyl-substituted hydroxystyrene resins, e.g., 4-hydroxy-3-methylstyrene resins and 4-hydroxy-3,5-dimethylstyrene resins; and the alkylated or acetylated products of the OH moieties of these resins can be preferably exemplified.

Further, such resins in which a part of the phenol nuclei of the above alkali-soluble resins (30 mol % or less of the total phenol nuclei) is hydrogenated are preferred in view of the improvement of transparency, sensitivity and resolving power and the formation of good pattern profiles. Partially hydrogenated novolak resins and partially hydrogenated polyhydroxystyrene can be exemplified as such a resin.

As other alkali-soluble resins which can be contained in the composition according to the present invention, acetone-pyrogallol resins, hydroxystyrene-N-substituted maleimide copolymers, partially O-alkylated or O-acylated polyhydroxystyrene, styrene-maleic anhydride copolymers, carboxyl group-containing methacrylic resins and the derivatives of them, and styrene-polyhydroxystyrene copolymers can be exemplified, but the present invention should not be construed as being limited thereto.

Examples of alkali-soluble resins which can be particularly preferably used in the present invention include novolak resins, alkali-soluble resins having a p-hydroxystyrene unit (preferably poly (p-hydroxystyrene), p/m-hydroxystyrene copolymers, p/o-hydroxystyrene copolymers, and p-hydroxystyrene-styrene copolymers), alkyl-substituted hydroxystyrene resins (e.g., 4-hydroxy-3-methylstyrene resins and 4-hydroxy-3,5-dimethylstyrene resins), the alkylated or acetylated products of the OH moieties of the above resins, polyhydroxystyrene resins, partially hydrogenated novolak resins and partially hydrogenated polyhydroxystyrene.

Polyhydroxystyrene in the present invention means the polymers obtained by polymerizing one or more monomers selected from a p-hydroxystyrene monomer, an m-hydroxystyrene monomer, an o-hydroxystyrene monomers, or these hydroxystyrene monomers in which the ortho-positions are substituted with an alkyl group having from 1 to 4 carbon atoms.

The above novolak resins can be obtained by addition condensation of aldehydes to a prescribed monomer as the main component in the presence of an acid catalyst.

As the prescribed monomers, phenol, cresols, e.g., m-cresol, p-cresol and o-cresol, xylenols, e.g., 2,5-xylenol, 3,5-xylenol, 3,4-xylenol and 2,3-xylenol, alkylphenols, e.g., m-ethylphenol, p-ethylphenol, o-ethylphenol, p-t-butylphenol, p-octylphenol and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols, e.g., 2-methyl-4-isopropylphenol, and hydroxy aromatic compounds, e.g., dihydroxybiphenyl, bisphenol A, phenylphenol, resorcinol and naphthol can be used alone or two or more as mixture, but the present invention is not limited thereto.

As the aldehydes, e.g., formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and the acetalized products of these aldehydes can be used. Of these aldehydes, formaldehyde is preferably used.

These aldehydes can be used alone, or two or more of them can be used in combination. As the acid catalyst, sulfuric acid, formic acid, acetic acid and oxalic acid can be used.

The alkali-soluble resin not containing an acid-decomposable group can be used in an amount of 50 wt % or less, preferably 30 wt % or less, and still more preferably 20 wt % or less, based on the total amount of the resins not containing an acid-decomposable group and containing an acid-decomposable group.

[II] (b) Compound which Generates Carboxylic Acid having Molecular Weight of 100 or Less upon Irradiation with an Actinic Ray or a Radiant Ray (Hereinafter Referred to as Also "(b) Photo-acid Generator")

A photo-acid generator (b) generates a carboxylic acid having a molecular weight of 100 or less upon irradiation with an actinic ray or a radiant ray, and functions to decompose the acid-decomposable group of acid-decomposable resin (a) to thereby increase the solubility of the resin in an alkali developer. Since the molecular weight of the generated carboxylic acid is 100 or less, by blending such a photo-acid generator into the positive radiation-sensitive composition according to the present invention, excellent resolving power and pattern profiles can be obtained even when considerable time has elapsed after exposure until post-baking. When the molecular weight of the generated carboxylic acid exceeds 100, such the effect cannot be obtained.

A compound represented by formula (I) is preferably used as photo-acid generator (b).

As the straight chain, branched or cyclic alkyl group having from 1 to 6 carbon atoms represented by $R_{11}$, $R_{12}$, $R_{13}$, $R_{14}$, $R_{15}$ and $R_0$ in formula (I), methyl, ethyl, n-propyl, isopropyl, cyclopropyl, n-butyl, isobutyl, sec-butyl, t-butyl, pentyl, isopentyl, neopentyl, cyclopentyl, hexyl and cyclohexyl are preferred, and methyl and ethyl are more preferred. As the straight chain, branched or cyclic alkoxyl group represented by $R_{11}$, $R_{12}$, $R_{13}$, $R_{14}$ and $R_{15}$, alkoxyl groups having from 1 to 6 carbon atoms can be exemplified, e.g.,methoxy, ethoxy, propoxy, isopropoxy, butoxy, pentyloxy and hexyloxy are preferred, and methoxy and ethoxy are more preferred.

As the aryl group represented by $R_0$, phenyl, tolyl, xylyl, mesityl and cumenyl are preferred, and phenyl is more preferred.

These aryl, alkoxyl and alkyl groups maybe substituted with a halogen atom, a nitro group, an alkoxyl group, an acetyl group, an amino group, an ester group, or an amido group.

As the halogen atom, fluorine, chlorine, bromine and iodine are preferred, and chlorine and bromine are more preferred.

Specific examples (PAG-B1) to (PAG-B6) of the compounds represented by formula (I) are shown below. These compounds generate an acetic acid, a propionic acid or a butyric acid according to the structure by actinic ray or radiant ray irradiation.

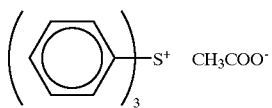
(PAG-B1)

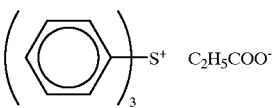
(PAG-B2)

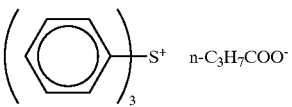
(PAG-B3)

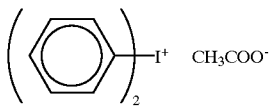
(PAG-B4)

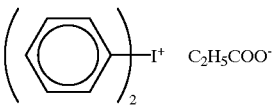
(PAG-B5)

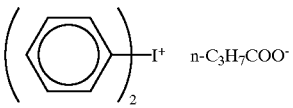
(PAG-B6)

(PAG-B1) and (PAG-B4) above are preferred above all.

The content of the photo-acid generator (b) in the composition according to the present invention is preferably from 0.1 to 20 wt %, more preferably from 0.5 to 10 wt %, and still more preferably from 1 to 7 wt %, based on the total solid contents of the composition.

When the compound (b') described later is used in the composition in combination with the photo-acid generator (b), the above-described effects of the present invention are more remarkably attained.

Compound (b') is described below.

[III] (b') Compound which Generates Sulfonic Acid upon Irradiation with an Actinic Ray or a Radiant Ray (hereinafter Referred to as Also "(b') Photo-acid Generator")

As the photo-acid generator (b'), compounds which generate sulfonic acid by photolysis represented by compounds described in M. Tunook et al., Polymer Preprints, Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0199672, 84515, 044115, 618564, 0101122, U.S. Pat. Nos. 4,371,605, 4,431,774, JP-A-64-18143, JP-A-2-245756, iminosulfonate described in JP-A-3-140109, etc., can be exemplified.

Of the above (b') compounds which are decomposed by actinic ray or radiant ray irradiation and generate a sulfonic acid, those particularly preferably used are described below.

(1) An iodonium salt represented by the following formula (PAG3), and a sulfonium salt represented by formula (PAG4)

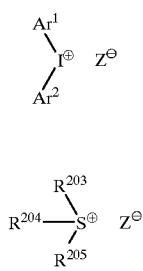
(PAG3)

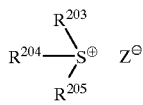
(PAG4)

wherein Ar¹ and Ar² each independently represents a substituted or unsubstituted aryl group. As preferred substituents, an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom can be exemplified.

$R^{203}$, $R^{204}$ and $R^{205}$ each independently represents a substituted or unsubstituted alkyl group or aryl group, preferably an aryl group having from 6 to 14 carbon atoms, an alkyl group having from 1 to 8 carbon atoms, and substitution derivatives of these groups. As preferred substituents of the aryl group, an alkoxyl group having from 1 to 8 carbon atoms, an alkyl group having from 1 to 8 carbon atoms, a cycloalkyl group, a nitro group, a carboxyl group, a mercapto group, a hydroxyl group and a halogen atom are exemplified. As preferred substituents of the alkyl group, an alkoxyl group having from 1 to 8 carbon atoms, a carboxyl group, and an alkoxycarbonyl group are exemplified.

$Z^-$ represents a counter anion, e.g., an alkanesulfonic acid anion which may be substituted, a benzenesulfonic acid anion which may be substituted, a naphthalenesulfonic acid anion which may be substituted, an anthracenesulfonic acid anion which may be substituted, a camphorsulfonic acid anion which may be substituted, and a sulfonic acid group-containing dye can be exemplified, but the present invention is not limited thereto.

Further, two of $R^{203}$, $R^{204}$ and $R^{205}$, or Ar¹ and Ar² may be bonded via respective single bonds or substituents.

As the photo-acid generator, for example, in formulae (PAG3) and (PAG4), when Ar¹, Ar², $R^{203}$, $R^{204}$ and $R^{205}$ each independently represents a substituted or unsubstituted aryl group, and $Z^-$ is generated as an acid by light irradiation, its diffusibility in a resist film is relatively small. Specifically, $Z^-$ represents a benzenesulfonic acid anion, a naphthalenesulfonic acid anion, or an anthracenesulfonic acid anion each having at least one group selected from branched or cyclic alkyl groups or alkoxyl groups having 8 or more carbon atoms, or at least two groups selected from straight chain, branched or cyclic alkyl groups or alkoxyl groups having from 4 to 7 carbon atoms, or at least three groups selected from straight chain or branched alkyl groups or alkoxyl groups having from 1 to 3 carbon atoms.

Specific examples of the iodonium salts and sulfonium salts are shown below but the present invention is not limited thereto.

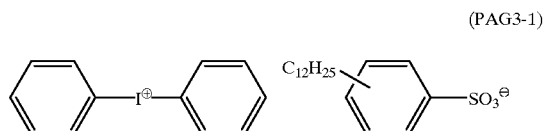
(PAG3-1)

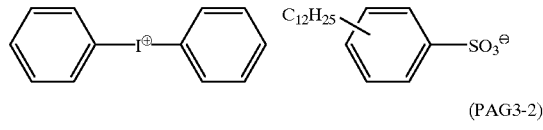
(PAG3-2)

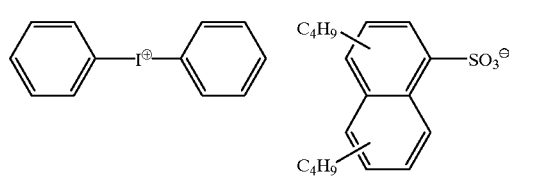
(PAG3-4)

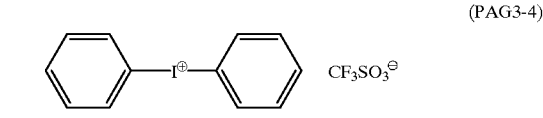
(PAG3-5)

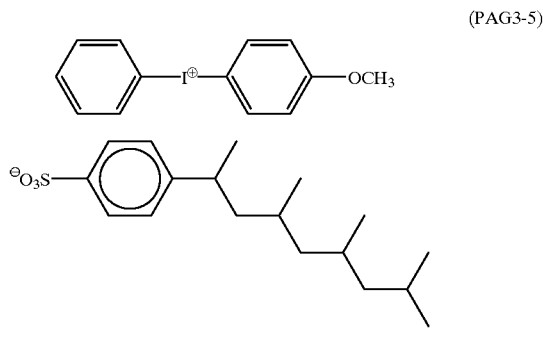
(PAG3-7)

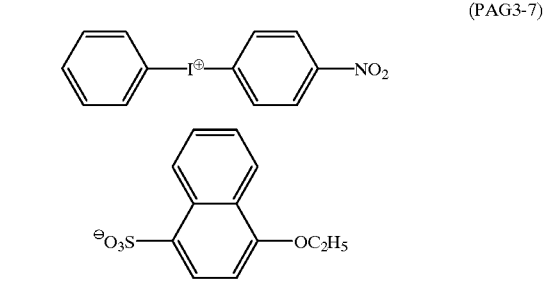
(PAG3-9)

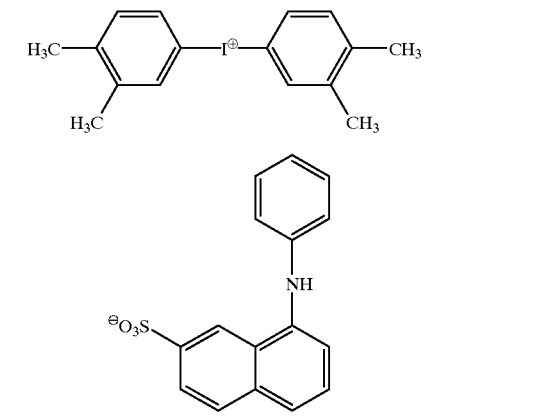

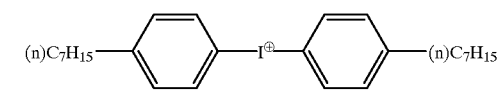
(PAG3-10)

-continued (PAG3-11)

(PAG3-12)

(PAG3-13)

(PAG3-14)

(PAG3-15)

-continued (PAG3-16)

(PAG3-17)

(PAG3-18)

(PAG3-19)

(PAG3-20)

(PAG3-21)

(PAG3-22)

-continued
(PAG4-1) 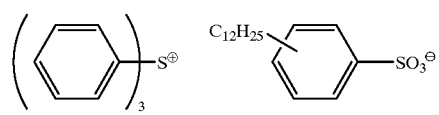
(PAG4-2) 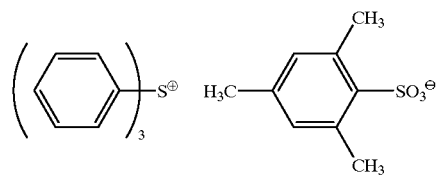
(PAG4-4) 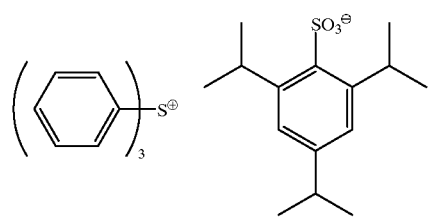
(PAG4-5) 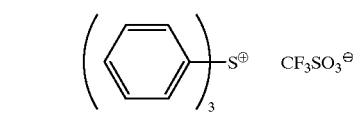
(PAG4-6) 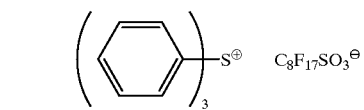
(PAG4-7) 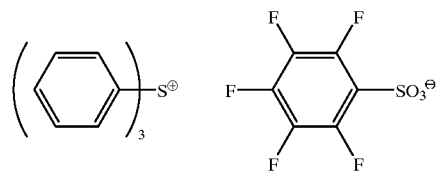
(PAG4-8) 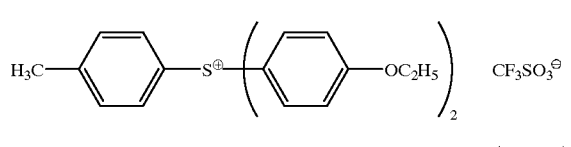
(PAG4-9) 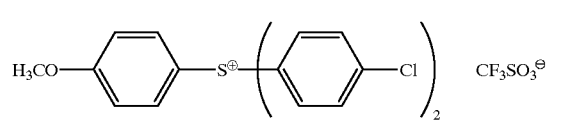
(PAG4-12) 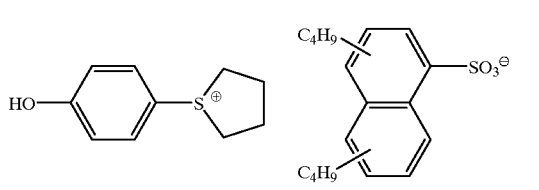
(PAG4-13) 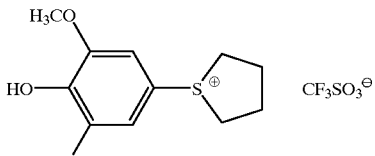
(PAG4-16) 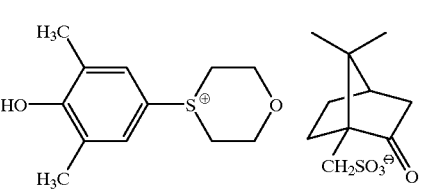
(PAG4-17) 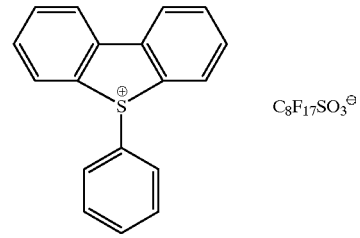
(PAG4-20) 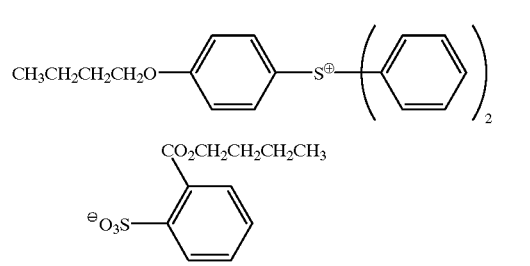
(PAG4-22) 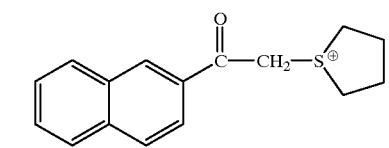
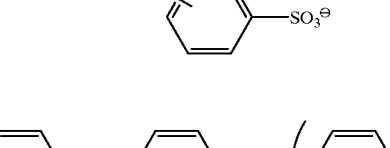
(PAG4-24) 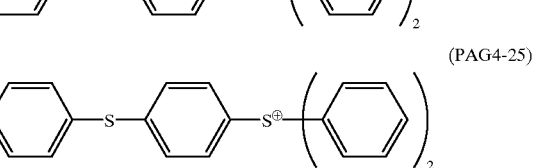
(PAG4-25) 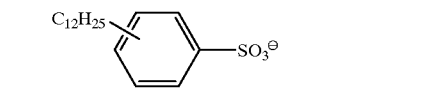

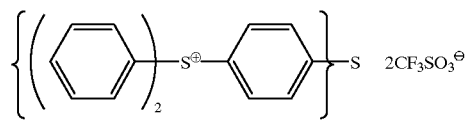 (PAG4-26)

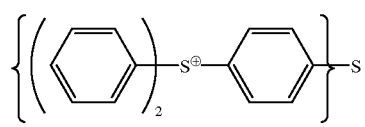 (PAG4-27)

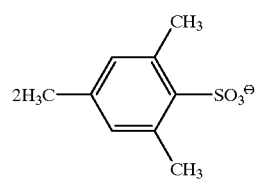 (PAG4-28)

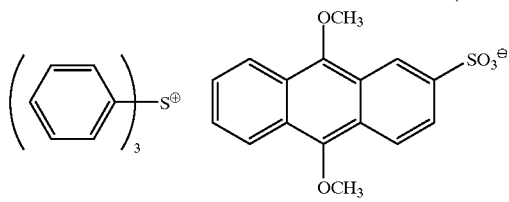 (PAG4-29)

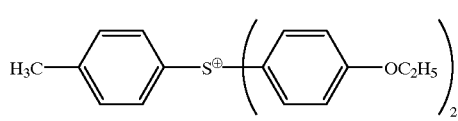 (PAG4-30)

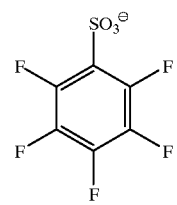 (PAG4-31)

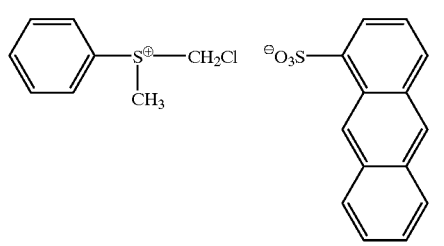

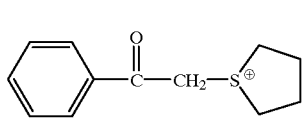 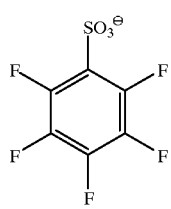

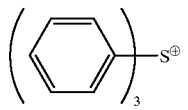 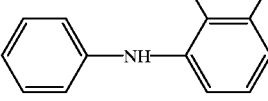

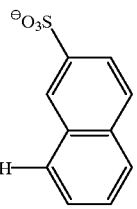 (PAG4-32)

Onium salts represented by formulae (PAG3) and (PAG4) are known and can be synthesized according to the methods described, e.g., in W. Knapczyk et al., *J. Am. Chem. Soc.*, 91, 145 (1969), A. L. Maycok et al., *J. Org. Chem.*, 35, 2532 (1970), B. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648, 4,247,473, and JP-A-53-101331.

(2) The iminosulfonate derivative represented by formula (PAG6)

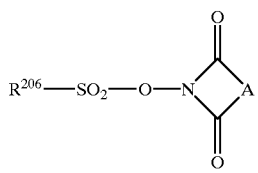 (PAG6)

wherein $R^{206}$ represents a substituted or unsubstituted alkyl group or aryl group; A represents a substituted or unsubstituted alkylene group, alkenylene group or arylene group.

Specific examples of the iminosulfonate derivatives are shown below but the present invention is not limited thereto.

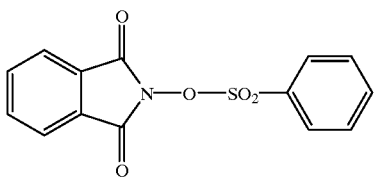 (PAG6-1)

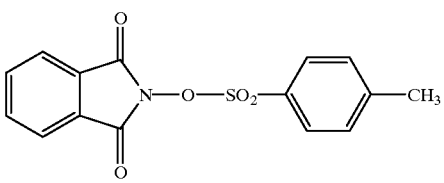 (PAG6-2)

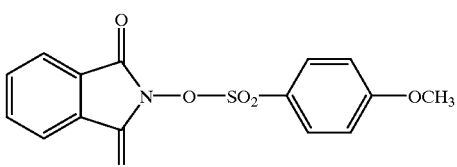 (PAG6-3)

(PAG6-4)
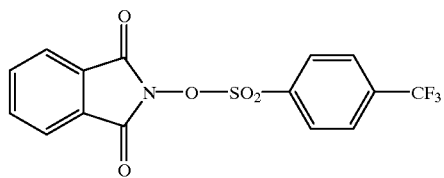
(PAG6-5)
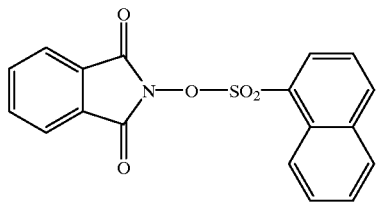
(PAG6-6)
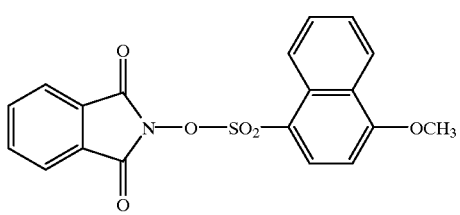
(PAG6-7)
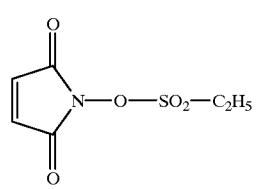
(PAG6-8)
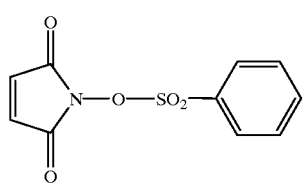
(PAG6-9)
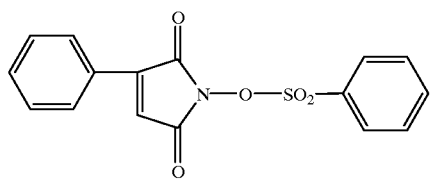
(PAG6-10)
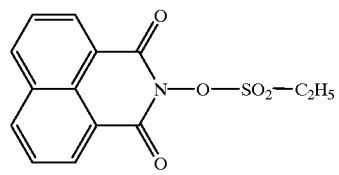
(PAG6-11)
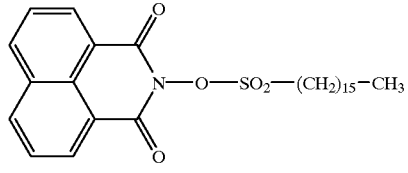
(PAG6-12)
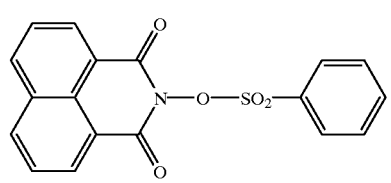
(PAG6-13)
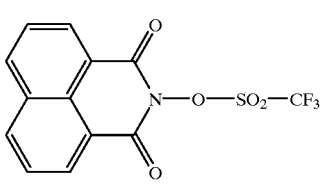
(PAG6-14)
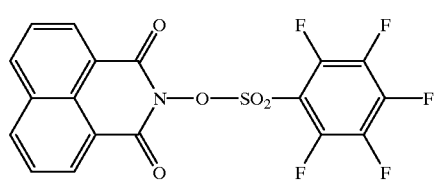
(PAG6-15)
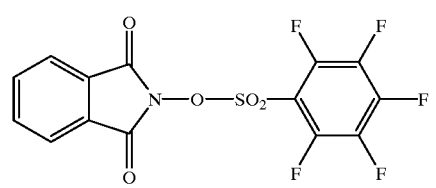
(PAG6-16)
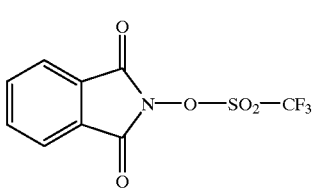
(PAG6-17)
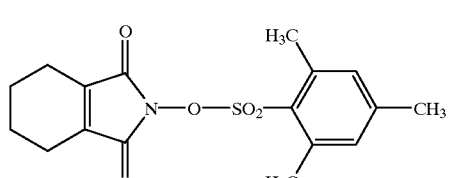
(PAG6-18)
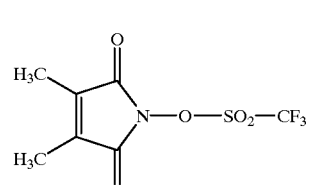
(PAG6-19)
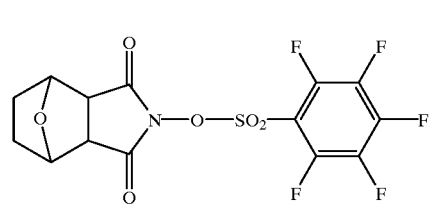

-continued

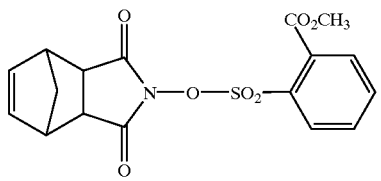

(PAG6-20)

The addition amount of the photo-acid generator (b') is generally from 0.1 to 20 wt %, preferably from 0.5 to 10 wt %, and more preferably from 1 to 7 wt %, based on the total solid contents of the composition.

[IV] (c) Solvent

Each component of the positive radiation-sensitive composition according to the present invention is dissolved in a solvent to prepare a coating solution and the resulting coating solution is coated on a support. The preferred solvents which can be used here are ethylene dichloride, cyclohexanone, cyclopentanone, 2-heptanone, y-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents can be used alone or two or more of them can be used in combination.

[V] (d) Surfactant

The positive radiation-sensitive composition of the present invention comprises a surfactant (c). The specific examples of the surfactants which can be used include nonionic surfactants such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenol ether and polyoxyethylene nonylphenol ether), polyoxyethylene polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate); fluorine-containing surfactants, e.g., Eftop EF301, EF303, EF352 (manufactured by Shin-Akita Kasei K.K.), Megafac F171, F173, F176, F189 and R08 (manufactured by Dainippon Ink & Chemicals, Inc.), Florad FC430, FC431 (manufactured by Sumitomo 3M, Inc.), and Asahi-Gard AG710, Surflon S-382, SC101, SC102, SC103, SC104, SC105, SC106 (manufactured by Asahi Glass Co., Ltd.); organosiloxane polymer, KP341 (manufactured by Shin-Etsu Chemical Industry Co., Ltd.), acrylic acid- or methacrylic acid-based (co) polymer, Polyflow No. 75 and No. 95 (manufactured by KyoeiSha Yushi Kagaku Kogyo K.K.), and Troysol S-366 (manufactured by Troy Chemical Industries, Inc.). The amount of these surfactants is generally 0.01 to 2 weight parts, preferably 0.01 to 1 weight parts, per 100 weight parts of the solid contents in the composition of the present invention. Of these surfactants, those containing at least one of a fluorine atom and a silicon atom are preferred.

These surfactants may be used alone or two or more of them may be used in combination.

[VI] Organic Basic Compound

It is preferred for the positive radiation-sensitive composition according to the present invention to comprise an organic basic compound.

The organic basic compound which can be preferably used in the present invention is a compound having stronger basicity than phenol. The nitrogen-containing basic compounds having the structures represented by the following formulae (A) to (E) are preferred above all. By using a nitrogen-containing basic compound, the performance change of the composition due to aging after exposure until post-baking is less.

(A)

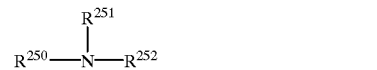

wherein $R^{250}$, $R^{251}$, and $R^{252}$ each independently represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be combined with each other to form a ring.

(B)

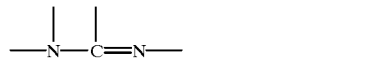

(C)

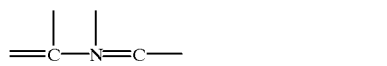

(D)

(E)

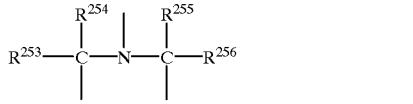

wherein $R^{253}$, $R^{254}$ and $R^{256}$, which are the same or different, each represents an alkyl group having from 1 to 6 carbon atoms.

The preferred examples of the nitrogen-containing basic compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, substituted or unsubstituted aminoalkylmorpholine, mono-, di- or trialkylamine, a substituted or unsubstituted aniline, substituted or unsubstituted piperidine, and mono- or diethanolamine. As the preferred substituents, an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

The specific examples of the preferred nitrogen-containing basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0]undeca-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethylthiourea, and N-hydroxyethylmorpholine, but the present invention is not limited thereto.

Of these, the particularly preferred compounds are 1,5-diazabicyclo[4.3.0]nona-5-ene, 1,8-diazabicyclo[5.4.0]undeca-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethylthiourea, and N-hydroxyethylmorpholine.

These nitrogen-containing basic compounds may be used alone or in combination of two or more.

The addition amount of the nitrogen-containing basic compound is generally from 0.001 to 10 wt %, preferably from 0.01 to 5wt %, based on the total solid contents of the composition. When the addition amount is less than 0.001 wt %, the effect of adding the nitrogen-containing basic compound cannot be obtained, while when it exceeds 10 wt %, the reduction of sensitivity and the degradation of developability of the unexposed domain are liable to be accompanied.

[VII] Other Components for use in the Present Invention

The positive radiation-sensitive composition of the present invention can further comprise, if necessary, a dye, a pigment, a plasticizer, a spectral sensitizer, a dissolution-inhibiting compound having a low molecular weight, and a compound having two or more phenolic OH groups accelerating the dissolution in a developing solution.

The compounds having two or more phenolic OH groups which can be used in the present invention are phenol compounds preferably having a molecular weight of 1,000 or less. At least two phenolic hydroxyl groups should be contained in the molecule, but if ten or more phenolic hydroxyl groups are contained, the improving effect of development latitude is lost. Further, when the ratio of the phenolic hydroxyl group to the aromatic ring is less than 0.5, the dependency on the film thickness is liable to become too large and also development latitude is liable to be narrow. When the ratio exceeds 1.4, the stability of the composition is deteriorated and it is difficult to obtain high resolving power and good film thickness dependency.

The addition amount of the phenolic hydroxyl group is preferably from 2 to 50 wt %, more preferably from 5 to 30 wt %, based on the alkali-soluble resin. If the addition amount exceeds 50 wt %, development residues increase and the deformation of a pattern occurs disadvantageously at development.

Such phenol compounds having a molecular weight of 1,000 or less can be synthesized easily with referring to the methods disclosed, e.g., in JP-A-4-122938, JP-A-2-28531, U.S. Pat. No. 4,916,210 and EP 219294.

The specific examples of phenol compounds are shown below, but those which can be used in the present invention are not limited thereto.

Resorcin, phloroglucine, 2,3,4-trihydroxybenzophenone, 2,3,4,4'-tetrahydroxybenzophenone, 2,3,4,3',4',5'-hexahydroxybenzophenone, acetone-pyrogallol condensed resins, phloroglucoside, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene) bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and para[α,α,α',α'-tetrakis(4-hydroxyphenyl)]xylene can be exemplified.

Oily dyes and basic dyes can be exemplified as appropriate dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Crystal Violet (C.I. 42555), Methyl Violet (C.I. 42535), Rhodamine B (C.I. 145170B), Malachite Green (C.I. 42000), and Methylene Blue (C.I. 52015) can be exemplified.

Further, it is possible for the composition of the present invention to have sensitivity to i-rays and g-rays by adding the spectral sensitizers shown below to sensitize the photo-acid generator in the longer wavelength region than far ultraviolet region where the photo-acid generator contained in the composition does not have absorption. The specific examples of the preferred spectral sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavine, Setoflavine-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, but the present invention is not limited to these compounds.

Further, the spectral sensitizer can also be used as the photo absorber of the far ultraviolet ray of the light source. In such a case, the photo absorber reduces the reflected light from the substrate and lessens the influence of multipath reflection in the resist film to thereby exhibit the effect of the improvement of the standing wave.

[VIII] Using Method etc. of the Positive Radiation-sensitive Composition of the Present Invention The positive radiation-sensitive composition of the present invention is coated on such a substrate as used in the manufacture of a precise integrated circuit element (e.g., silicon/silicon dioxide coating) by an appropriate coating means such as a spinner or a coater, and then subjected to exposure through a prescribed mask and baking, development, thereby a good resist pattern can be obtained.

As the developer of the positive radiation-sensitive composition of the present invention, an alkaline aqueous solution of inorganic alkalis, e.g., sodium hydroxide, potassium hydroxide, sodium carbonate, sodium silicate, sodium metasilicate, and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, or cyclic amines, e.g., pyrrole and piperidine can be used.

Further, appropriate amounts of alcohols and surfactants may be added to the above alkaline aqueous solution.

EXAMPLE

The present invention is explained in more detail with reference to the following examples, but the present invention should not be construed as being limited thereto.

(a) Acid-decomposable resins, (b) photo-acid generators, and (b') photo-acid generators for use in Examples and Comparative Examples are shown below.

Acid-decomposable Resin

P1: p-[1-(ethoxy)ethoxy]styrene/p-hydroxystyrene (35/65)
P2: p-[1-(cyclohexylethoxy)ethoxy]styrene/p-hydroxystyrene (30/70)
P3: p-[1-(cyclohexylethoxy)ethoxy]styrene/p-acetoxystyrene/p-hydroxystyrene (30/10/60)
P4: p-[1-(cyclohexylethoxy)ethoxy]styrene/p-t-butylstyrene/p-hydroxystyrene (30/10/60)
P5: p-[1-(benzyloxy)ethoxy]styrene/p-hydroxystyrene (30/70)
P6: p-[1-(phenethyloxyethoxy)ethoxy]styrene/p-acetoxystyrene/p-hydroxystyrene (30/10/60)

In each of the above resins, the weight average molecular weight of the polyhydroxystyrene before a protective group etc. are imparted (the value in terms of styrene obtained by GPC measurement) of P1 to P3, P4 and P5, and P6 are 8,000, 15,000, and 20,000, respectively.

(b) Photo-acid Generator

PAG-B1: $(ph)_3S^+CH_3COO^-$
PAG-B2: $(ph)_3S^+C_2H_5COO^-$
PAG-B3: $(ph)_3S^+n\text{-}C_3H_7COO^-$
PAG-B4: $(ph)_2I^+CH_3COO^-$
PAG-B5: $(ph)_2I^+C_2H_5COO^-$
PAG-B6: $(ph)_2I^+n\text{-}C_3H_7COO^{31}$
PAG-B7: $(ph)_3S^+n\text{-}C_4H_9COO^-$
PAG-B8: $(ph)_2I^+n\text{-}C_4H_9COO^-$ in the above formulae, ph represents a phenyl group.

(b') Photo-acid Generator

PAG-A1, PAG-A2 and PAG-A3 having the following structures respectively:

PAG-A1:

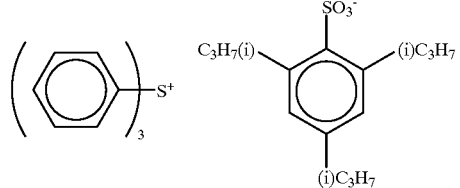

PAG-A2:

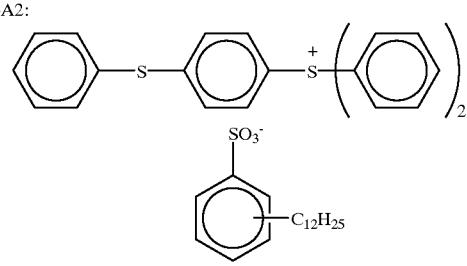

PAG-A3:

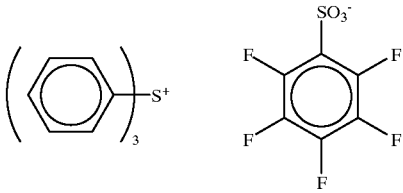

Surfactant
R08: Megafac R08 (manufactured by Dainippon Ink & Chemicals, Inc.)
W-1: Troysol S-366 (manufactured by Troy Chemical Industries, Inc.)

Organic Basic Compound
E-1 and E-2 having the following structures respectively:

E-1:

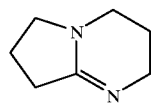

E-2:

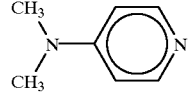

Synthesis of (a) Acid-decomposable Resin

Synthesis Example 1
Synthesis of Acid-Decomposable Resin P2 p-Hydroxystyrene (70 g) (VP-8000, manufactured by Nippon Soda Co., Ltd.) was dissolved by heating in 320 g of propylene glycol monomethyl ether acetate (PGMEA), the solution was dehydrated by performing vaccum distillation, and then cooled to 20° C. To this solution were added 0.35 g of pyridinium -p-toluenesulfonate and 22.4 g of cyclohexane ethanol. t-Butyl vinyl ether (17.5 g) was added slowly to the solution and the solution was allowed to react at 20° C. for 5 hours. Triethylamine (0.28 g) and 320 ml of ethyl acetate were added to the reaction solution and the solution was washed with 150 ml of distilled water three times. The solvent was distilled off and the solution was concentrated. The obtained oil was dissolved in 100 ml of acetone and the resulted solution was poured slowly into 2 liters of distilled water. The precipitated powder was filtered and dried, thereby 54 g of the objective product was obtained.

Synthesis Example 2
Synthesis of Acid-Decomposable Resin P3 p-Hydroxystyrene (70 g) (VP-8000, manufactured by Nippon Soda Co., Ltd.) was dissolved by heating in 320 g of propylene glycol monomethyl ether acetate (PGMEA), the solution was dehydrated by performing vaccum distillation, and then cooled to 20° C. To this solution were added 0.35 g of pyridinium -p-toluenesulfonate and 22.4 g of cyclohexaneethanol. t-Butyl vinyl ether (17.5 g) was added slowly to the solution and the solution was allowed to react at 20° C. for 5 hours. Pyridine (5.53 g) was added to the reaction solution, then 5.9 g of acetic anhydride was added slowly, and the solution was allowed to react at room temperature for one hour. Ethyl acetate (320 ml) was added thereto and the solution was washed with 150 ml of distilled water three times. The solvent was distilled off and the solution was concentrated. The obtained oil was dissolved in 100 ml of acetone and the resulted solution was poured slowly into 2 liters of distilled water. The precipitated powder was filtered and dried, thereby 58 g of the objective product was obtained.

Resin P1, P4 to P6 were synthesized in a similar manner.

Synthesis of (b) Photo-acid Generator

Synthesis Example 3
Synthesis of Photo-acid Generator PAG-B1 (Triphenylsulfonium acetate)

Triphenylsulfonium iodide (20 g) was dissolved in 500 ml of methanol, 12.5 g of silver(I) oxide was added thereto, and the solution was stirred at room temperature for 4 hours. The reaction solution was filtered to remove the silver compound and 4.0 g of acetic acid was added to the filtrate. The solution was concentrated and the obtained oily product was washed with 300 ml of diisopropyl ether two times, thereby 11.2 g of the objective product was obtained.

PAG-B2, PAG-B3 and PAG-B7 were synthesized in a similar manner.

Synthesis Example 4
Synthesis of Photo-acid Generator PAG-B4 (Diphenyliodonium acetate)

Diphenyliodonium iodide (50 g) was dissolved in 2 liters of methanol, 22 g of silver(I) oxide was added thereto, and the solution was stirred at room temperature for 4 hours. The reaction solution was filtered to remove the silver compound and 7.5 g of acetic acid was added to the filtrate. The solution was concentrated and the obtained solid product was washed with 300 ml of diisopropyl ether, thereby 32 g of the objective product was obtained.

PAG-B5, PAG-B6 and PAG-B8 were synthesized in a similar manner.

Synthesis of (b') Photo-acid Generator

Synthesis Example 5
Synthesis of Photo-acid Generator PAG-A1

Diphenyl sulfoxide (50 g) was dissolved in 800 ml of benzene, 200 g of aluminum chloride was added thereto, and the reaction mixture was refluxed for 24 hours. The reaction solution was poured slowly into 2 liters of ice, 400 ml of concentrated hydrochloric acid was added thereto, and the solution was heated at 70° C. for 10 minutes. This aqueous solution was washed with 500 ml of ethyl acetate and filtered. Ammonium iodide (200 g) dissolved in 400 ml of water was added to the above solution. The precipitated powder was filtered, washed with water, then washed with ethyl acetate and dried, thereby 70 g of triphenylsulfonium iodide was obtained. The triphenylsulfonium iodide (50 g) was dissolved in 300 ml of methanol, 31 g of silver oxide was added thereto and stirred for 4 hours. The reaction solution was filtered and 45 g of 2,4,6-triisopropylbenzenesulfonic acid tetramethylammonium salt (obtained by reacting 2,4,6-triisopropylbenzenesulfonyl chloride in tetramethylammonium hydroxide, water and methanol with heating) was added to the filtrate. The powder obtained by concentrating the above solution was washed thoroughly with water and recrystallized from ethyl acetate/acetone, thereby 50 g of PAG-A1 was obtained.

Synthesis Example 6
Synthesis of Photo-acid Generator PAG-A2

An aqueous solution (19.9 g) (0.030 mol) of the mixture of commercially available triaryl sulfonium Cl salt (a 50% aqueous solution of triphenylsulfonium chloride, manufactured by Fluka Co.), triphenylsulfonium, 4,4'-bis (diphenylsulfonio) diphenyl sulfide, etc., was dissolved in 200 ml of ion exchange water. A solution of 400 ml of ion exchange water containing 10.5 g (0.030 mol) of Na salt of hard type (branched) dodecylbenzenesulfonic acid having the structure shown below was added to this solution with stirring at room temperature.

The precipitated viscous solids were separated by decantation, and washed with 1 liter of ion exchange water.

The precipitated viscous solids were dissolved in 100 ml of acetone, the solution was put into 500 ml of ion exchange water with stirring and recrystallized. The precipitant was dried in vacuo at 50° C., thereby 15.5 g of a vitreous solid was obtained. The solid was confirmed to be the objective photo-acid generator (PAG-A2) by NMR analysis.

Synthesis Example 7
Synthesis of Photo-acid Generator PAG-A3

Diphenyl sulfoxide (50 g) was dissolved in 800 ml of benzene, 200 g of aluminum chloride was added thereto, and the reaction mixture was refluxed for 24 hours. The reaction solution was poured slowly into 2 liters of water, 400 ml of concentrated hydrochloric acid was added thereto, and the solution was heated at 70° C. for 10 minutes. This aqueous solution was washed with 500 ml of ethyl acetate and filtered. Ammonium iodide (200 g) dissolved in 400 ml of water was added to the above solution.

The precipitated powder was filtered, washed with water, then washed with ethyl acetate and dried, thereby 70 g of triphenylsulfonium iodide was obtained.

The triphenylsulfonium iodide (30.5 g) was dissolved in 1,000 of methanol, 19.1 g of silver oxide was added thereto and stirred at room temperature for 4 hours. The reaction solution was filtered and the excess amount of the solution of pentafluorobenzenesulfonic acid tetramethylammonium salt was added to the filtrate. The reaction solution was concentrated and dissolved in 500 ml of dichloromethane. This solution was washed with a 5% aqueous solution of tetramethylammonium hydroxide and water. The organic phase was dried over an hydrous sodium sulfate and concentrated, thereby triphenylsulfonium pentafluorobenzenesulfonate was obtained.

Examples 1 to 16 and Comparative Examples 1 to 6
Preparation of Composition and Evaluation Each of the components shown in Table 1 below was dissolved in 8 g of a solvent PGMEA (propylene glycol monomethyl ether acetate) and filtered through a filter having a pore diameter of 0.1 μm, thereby a resist solution was prepared. The resist solution was coated on a silicon wafer by means of a spin coater, dried at 130° C. for 90 seconds by a vacuum suction type hot plate, thereby a resist film having a thickness of 0.4 μm was obtained. However, in Example 10, a mixed solvent comprising 5.6 g of PGMEA and 2.4 g of PGME (propylene glycol monomethyl ether) and in Example 13, a mixed solvent comprising 6.4 g of PGMEA and 1.6 g of PGME were used respectively.

TABLE 1

| Example No. | Acid-Decomposable Resin (g) | Photo-Acid Generator (g) | Organic Basic Compound (g) | Surfactant (ppm) |
|---|---|---|---|---|
| Example 1 | P1 (0.16) | PAG-A1 (0.04) PAG-B1 (0.04) | E1 (0.0015) | R08 (100) |
| Example 2 | P1 (0.16) | PAG-A1 (0.04) PAG-B1 (0.04) | E2 (0.0015) | R08 (100) |
| Example 3 | P2 (0.16) P3 (0.16) | PAG-A1 (0.04) PAG-B1 (0.04) | E1 (0.0015) | R08 (100) |
| Example 4 | P2 (0.16) | PAG-A1 (0.04) PAG-B1 (0.04) | E2 (0.0015) | R08 (100) |
| Example 5 | P3 (0.16) | PAG-A2 (0.04) PAG-B2 (0.04) | E1 (0.0015) | R08 (100) |
| Example 6 | P3 (0.16) | PAG-A2 (0.04) PAG-B2 (0.04) PAG-B3 (0.04) | E1 (0.0015) | R08 (100) |
| Example 7 | P3 (0.16) | PAG-A2 (0.04) PAG-B3 (0.04) | E1 (0.0015) | W-1 (100) |
| Example 8 | P3 (0.16) P1 (0.16) | PAG-A2 (0.04) PAG-B3 (0.04) | E2 (0.0015) | W-1 (100) |
| Example 9 | P3 (0.16) | PAG-A2 (0.04) PAG-B3 (0.04) | E1 (0.0015) | W-1 (100) |
| Example 10 | P3 (0.16) | PAG-A3 (0.04) PAG-B4 (0.04) | E1 (0.0015) | W-1 (100) |
| Example 11 | P4 (0.16) | PAG-A1 (0.04) PAG-A3 (0.04) PAG-B4 (0.04) | E1 (0.0015) | W-1 (100) |
| Example 12 | P4 (0.16) | PAG-A3 (0.04) PAG-B5 (0.04) | E1 (0.0015) | W-1 (100) |
| Example 13 | P4 (0.16) | PAG-A1 (0.04) PAG-B5 (0.04) | E2 (0.0015) | W-1 (100) |
| Example 14 | P5 (0.16) | PAG-A1 (0.04) PAG-B6 (0.04) | E1 (0.0015) | W-1 (100) |
| Example 15 | P6 (0.16) | PAG-A1 (0.04) PAG-B6 (0.04) | E2 (0.0015) | W-1 (100) |
| Example 16 | P6 (0.16) | PAG-B1 (0.08) | E1 (0.0015) | W-1 (100) |
| Comparative Example 1 | P1 (0.16) | PAG-A1 (0.08) | E1 (0.0015) | R08 (100) |
| Comparative Example 2 | P1 (0.16) | PAG-A2 (0.08) | E1 (0.0015) | R08 (100) |
| Comparative Example 3 | P2 (0.16) | PAG-A1 (0.08) | E1 (0.0015) | W-1 (100) |
| Comparative Example 4 | P3 (0.16) | PAG-A2 (0.08) | E1 (0.0015) | W-1 (100) |
| Comparative Example 5 | P1 (0.16) | PAG-A7 (0.08) | E1 (0.0015) | W-1 (100) |
| Comparative Example 6 | P2 (0.16) | PAG-A8 (0.08) | E1 (0.0015) | W-1 (100) |

Each resist film was subjected to exposure with a 248 nm wavelength Kr eximer laser stepper (NA=0.63). After exposure, the wafer was allowed to stand in the atmosphere of amine concentration of 5 ppm or less for 2 hours, then heated on a hot plate at 100° C. for 90 seconds, immersed in an aqueous solution of 0.26 N tetramethylammonium hydroxide (TMAH) for 60 seconds immediately after heating, rinsed with water for 30 seconds and dried. The line pattern of which is obtained on the silicon wafer was determined with a Critical Dimension scanning electron microscope (CD-SEM) and the shape of the pattern top was observed.

The determination of the length and the observation of the pattern top were performed with the pattern obtained by heating and development process immediately after exposure and the pattern obtained by heating and development process two hours after exposure.

The rate of the dimensional change of the pattern obtained by heating and development process two hours after exposure was made the index of PED (post exposure delay) with the dimension of the pattern obtained by heating and development process immediately after exposure as a standard.

The shape of the pattern top was evaluated according to the following two stages.

A: Rectangular shape
B: Round top shape

The results obtained are shown in Table 2 below.

TABLE 2

| Example No. | PED (%) | Top Profile Shape Immediately after Exposure | Top Profile Shape Two Hours after Exposure |
|---|---|---|---|
| Example 1 | 7 | A | A |
| Example 2 | 8 | A | A |
| Example 3 | less than 5 | A | A |
| Example 4 | less than 5 | A | A |
| Example 5 | less than 5 | A | A |
| Example 6 | less than 5 | A | A |
| Example 7 | less than 5 | A | A |
| Example 8 | less than 5 | A | A |
| Example 9 | less than 5 | A | A |
| Example 10 | less than 5 | A | A |
| Example 11 | less than 5 | A | A |
| Example 12 | less than 5 | A | A |
| Example 13 | less than 5 | A | A |
| Example 14 | less than 5 | A | A |
| Example 15 | less than 5 | A | A |
| Example 16 | 10 | A | A |
| Comparative Example 1 | 15 | A | B |
| Comparative Example 2 | 20 | A | B |
| Comparative Example 3 | 24 | A | B |
| Comparative Example 4 | 13 | A | B |
| Comparative Example 5 | 18 | A | B |
| Comparative Example 6 | 20 | A | B |

As is apparent from the results in Table 2, the positive radiation-sensitive composition of the present invention is small in dimensional change (PED is small) and excellent in the shape of the resist pattern even when heating and development process are performed two hours after exposure.

On the other hand, the compositions in Comparative Examples 1 to 4 in which the compounds generating sulfonic acid by exposure are used alone as the photo-acid generators show large dimensional change (PED is large) when heating and development process are performed two hours after exposure and the shape of the excellent resist pattern cannot be retained. Comparative examples 5 and 6 in which compounds generating carboxylic acids having a molecular weight of more than 100 are used show also the same result.

EFFECT OF THE INVENTION

According to the positive radiation-sensitive composition of the present invention, a positive resist having large tolerance of process capable of obtaining excellent resolving power and a pattern profile even when considerable time has elapsed after exposure until post-baking can be obtained.

While the invention has been described in detail and with reference to specific examples thereof, it will be apparent to one skilled in the art that various changes and modifications can be made therein without departing from the spirit and scope thereof.

What is claimed is:
1. A positive radiation-sensitive composition comprising:
(a) a resin whose solubility in an alkali developer increases by the action of an acid;

(b) a compound that generates a carboxylic acid having a molecular weight of 100 or less upon irradiation with an actinic ray or a radiant ray;
(c) a surfactant; and
(d) a solvent,
wherein compound (b) is present in an amount of from 1 to 20 wt % based upon the solid contents, and the compound (b) is a compound represented by the following formula (I):

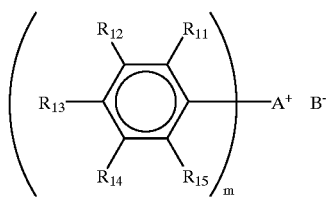

(I)

wherein $R_{11}$, $R_{12}$, $R_{13}$, $R_{14}$ and $R_{15}$ each independently represents a hydrogen atom, a straight chain, branched or cyclic alkyl group, a straight chain, branched or cyclic alkoxyl group, a hydroxyl group, a halogen atom, or —S—$R_0$; $R_0$ represents a straight chain, branched or cyclic alkyl hydroxyl group, a halogen atom, or —S—$R_0$; $R_0$ represents a straight chain, branched or cyclic alkyl group, or an aryl group, $A^+$ represents $S^+$ or $I^+$; $B^-$ represents $CH_3COO^-$, $C_2H_5COO^-$ or $C_3H_7COO^-$; and m represents 2 or 3.

2. The positive radiation-sensitive composition as claimed in claim 1, which further comprises (b') a compound that generates a sulfonic acid upon irradiation with an actinic ray or a radiant ray.

3. The positive radiation-sensitive composition as claimed in claim 2, wherein the compound (b') is a compound represented by the following formula (PAG3), (PAG4) or (PAG6):

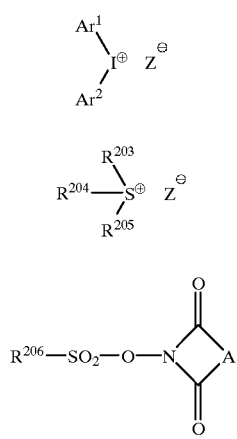

(PAG3)

(PAG4)

(PAG6)

wherein $Ar^1$ and $Ar^2$ each independently represents a substituted or unsubstituted aryl group; $R^{203}$, $R^{204}$ and $R^{205}$ each independently represents a substituted or unsubstituted alkyl or aryl group; $R^{206}$ represents a substituted or unsubstituted alkyl or aryl group; A represents a substituted or unsubstituted alkylene, alkenylene or arylene group.

4. The positive radiation-sensitive composition as claimed in claim 2, which contains the compound (b') in an amount of from 1 to 20 wt % based on the solid contents.

5. The positive radiation-sensitive composition as claimed in claim 1, wherein the resin (a) has an acid-decomposable group represented by the following formula (II):

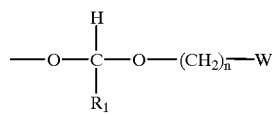

(II)

wherein $R_1$ represents an alkyl group having from 1 to 4 carbon atoms; W represents an amino group, an ammonium group, a mercapto group, a substituted or unsubstituted aryl group, a substituted or unsubstituted cycloalkyl group, or an organic group containing (i) at least one atom selected from the group consisting of an oxygen atom, a nitrogen atom, a sulfur atom, a phosphorus atom and a silicon atom, and (ii) at least one carbon atom; and n represents a natural number of from 1 to 4.

6. The positive radiation-sensitive composition as claimed in claim 5, wherein W of said formula (II) is a group represented by the following formula:

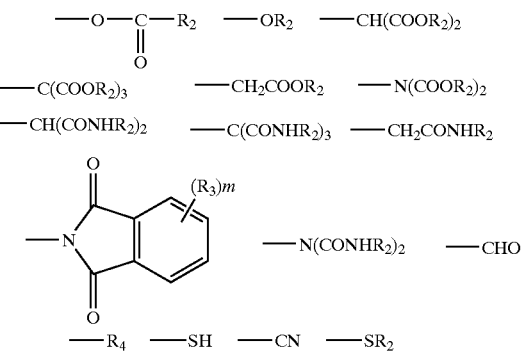

wherein $R_2$ represents a hydrogen atom, a straight chain, branched or cyclic alkyl group having from 1 to 6 carbon atoms, a straight chain, branched or cyclic alkenyl group having from 2 to 6 carbon atoms, a substituted or unsubstituted aryl group, or a substituted or unsubstituted aralkyl group; R3 represents a hydrogen atom, a straight chain, branched or cyclic alkyl group having from 1 to 6 carbon atoms, a straight chain, branched or cyclic alkoxyl group having from 1 to 6 carbon atoms, a halogen atom, a nitro group, an amino group, a hydroxyl group, or a cyano group; $R_4$ represents a substituted or unsubstituted aryl group, or a substituted or unsubstituted cycloalkyl group having from 3 to 15 carbon atoms; m represents a natural number of from 1 to 4.

7. The positive radiation-sensitive composition as claimed in claim 5, wherein the resin (a) is a resin in which 5 to 45 mol % of an entire phenolic hydroxyl groups in an alkali-soluble resin are protected with an acid-decomposable group represented by the formula (II).

8. The positive radiation-sensitive composition as claimed in claim 1, wherein the resin (a) is a resin in which phenolic hydroxyl groups in an alkali-soluble resin are at least partiy protected with the acid-decomposable group represented by the formula (II).

9. The positive radiation-sensitive composition as claimed in claim 1, which further comprises an organic basic compound.

10. The positive radiation-sensitive composition as claimed in claim 1, wherein the compound (b) is at least one compound selected from the group consisting of the following (PAG-B 1) to (PAG-B6):

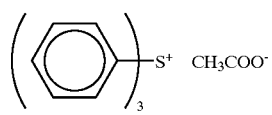
(PAG-B1)

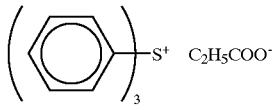
(PAG-B2)

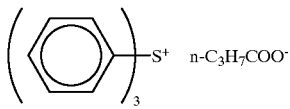
(PAG-B3)

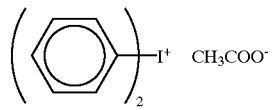
(PAG-B4)

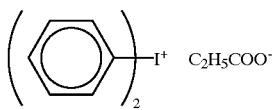
(PAG-B5)

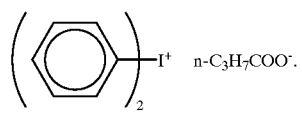
(PAG-B6)

11. The positive radiation-sensitive composition as claimed in claim 10, wherein the compound (b) is at least one compound selected from the group consisting of the above (PAG-B1) and (PAG-B4).

12. The positive radiation-sensitive composition as claimed in claim 1, wherein the resin (a) has a weight average molecular weight of from 3,000 to 80,000.

13. The positive radiation-sensitive composition as claimed in claim 1, wherein the surfactant (c) contains at least one of a fluorine atom and a silicon atom.

* * * * *